(12) United States Patent
Alhoussami et al.

(10) Patent No.: US 8,704,554 B1
(45) Date of Patent: Apr. 22, 2014

(54) SUPPRESSING ELECTRICAL BUS TRANSIENTS IN ELECTRONIC CIRCUITRY

(75) Inventors: Aiman Alhoussami, Austin, TX (US); Andreas Gerasimos Ladas, Kingston, RI (US)

(73) Assignee: Picor Corporation, North Smithfield, RI (US)

( * ) Notice: Subject to any disclaimer, the term of this patent is extended or adjusted under 35 U.S.C. 154(b) by 0 days.

(21) Appl. No.: 13/335,346

(22) Filed: Dec. 22, 2011

(51) Int. Cl.
   *H03K 3/00* (2006.01)
(52) U.S. Cl.
   USPC .................. 327/108; 327/112; 327/377
(58) Field of Classification Search
   USPC .......................... 327/108, 112, 377
   See application file for complete search history.

(56) References Cited

U.S. PATENT DOCUMENTS

| 4,028,737 | A | 6/1977 | Bailey ........................ 361/86 |
| 4,679,112 | A | 7/1987 | Craig ......................... 361/33 |
| 5,347,169 | A | 9/1994 | Preslar et al. ............... 307/246 |
| 5,401,996 | A | 3/1995 | Kelly ......................... 257/360 |
| 5,584,030 | A | 12/1996 | Husak et al. ................. 395/750 |
| 6,407,937 | B2 | 6/2002 | Bruckmann et al. ......... 363/56.05 |
| 6,717,785 | B2 * | 4/2004 | Fukuda et al. .............. 361/93.1 |
| 7,151,401 | B2 * | 12/2006 | Inoue ......................... 327/434 |

OTHER PUBLICATIONS

Linear Technology, "LTC4218CGN/LTC4218CDHC-12", Demo Circuit 1052 Quick Start Guide, pp. 1-4, Feb. 5, 2008.
Texas Instruments, "TPS2490 and TPS2491 Positive High-Voltage Power-Limiting Hot swap Controller," 23 pages, SLVS503B, Nov. 2003, Revised Mar. 2010.
Texas Instruments, "TPS2490 and TPS2491, +48 V Hot Swap Power Manager Evaluation Kit User's Guide," 2007.

* cited by examiner

*Primary Examiner* — Kenneth B. Wells
(74) *Attorney, Agent, or Firm* — Fish & Richardson P.C.

(57) ABSTRACT

An apparatus and method for protecting a switch from overvoltage transients that might otherwise occur when the switch is turned off. A transient-suppression controller controls a rate-of-change of voltage across a switch by delivering control signals to the switch. Controlling the rate-of-change of voltage enables controlled absorption of stored parasitic energy that might otherwise cause overvoltage transients. In some embodiments the switch is a MOSFET and the control signals are currents delivered to the gate of the MOSFET. In some embodiments, control is open-loop; in other embodiments closed-loop control is used to maintain essentially constant voltage across the switch as it turns off.

56 Claims, 16 Drawing Sheets

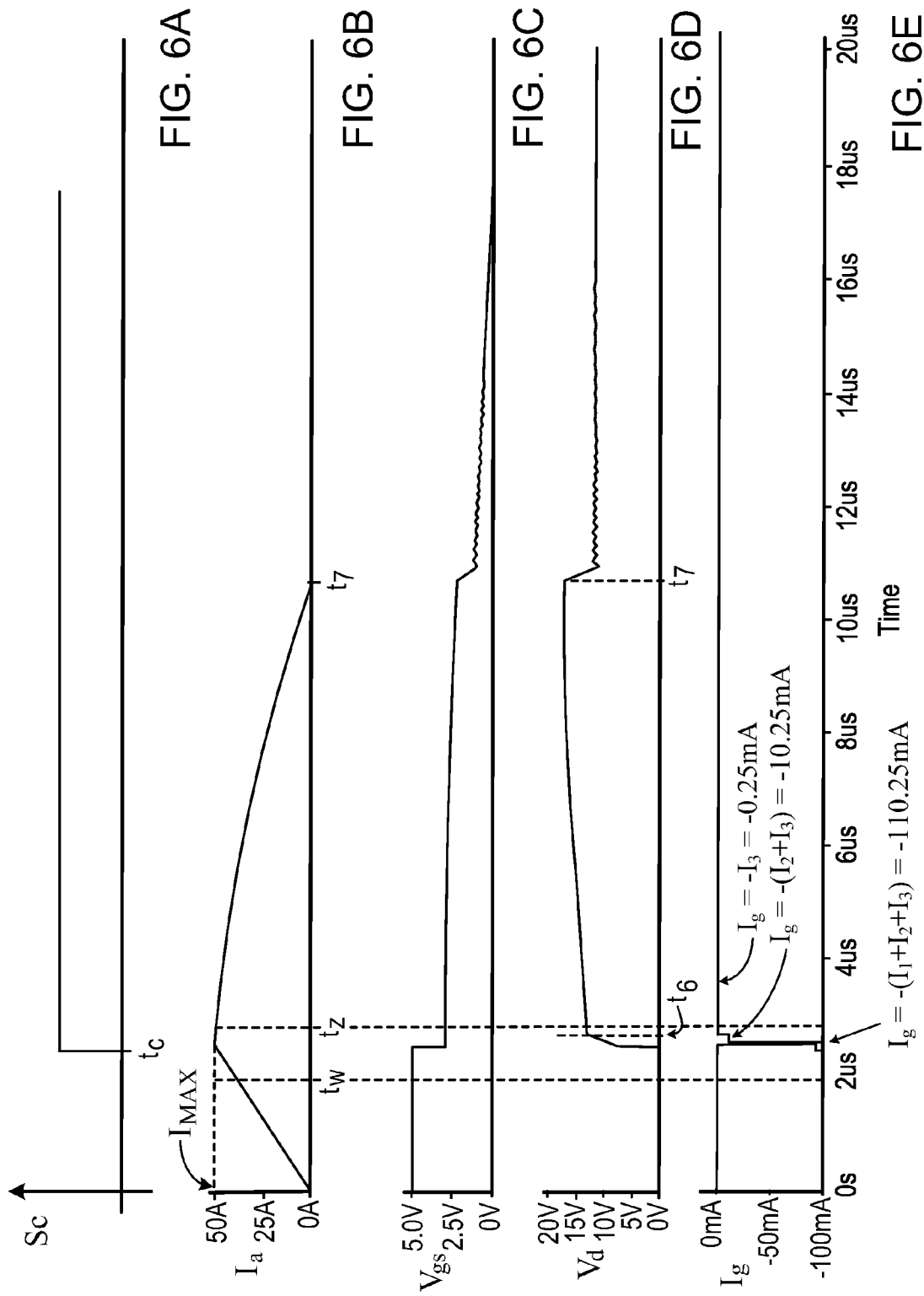

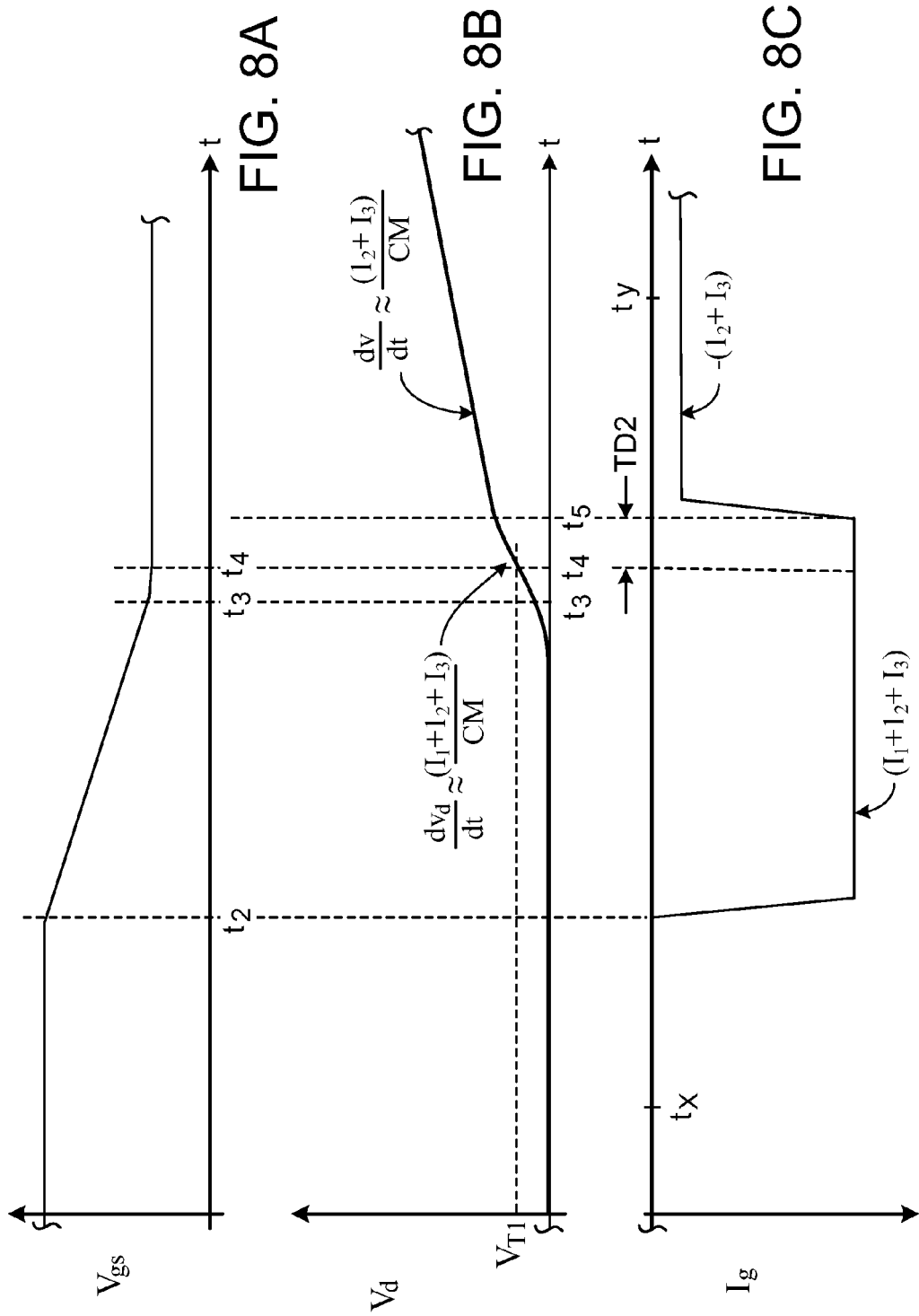

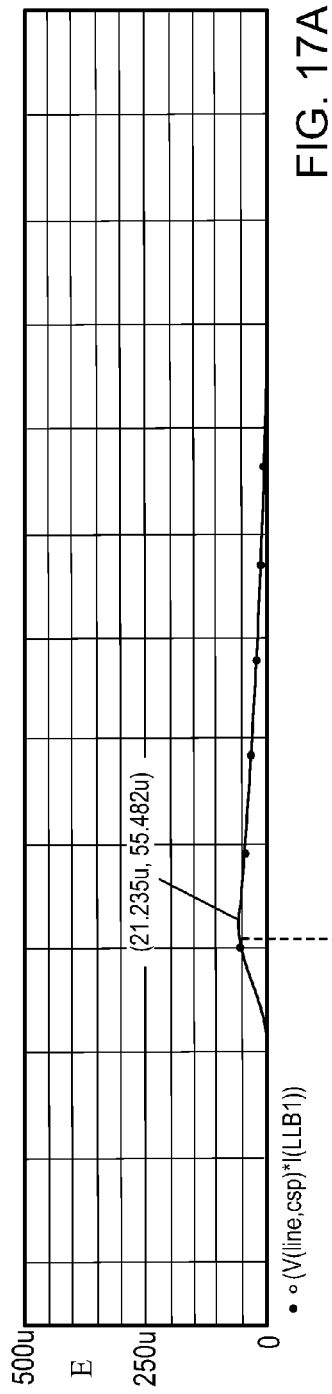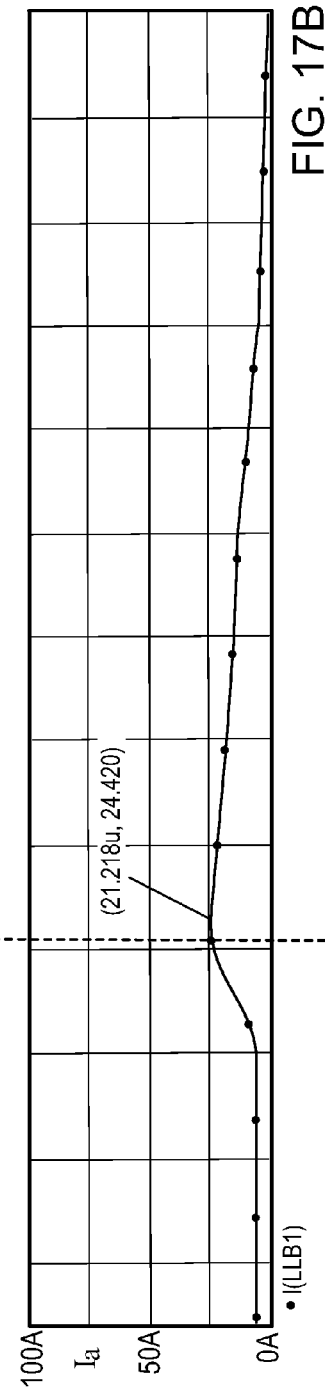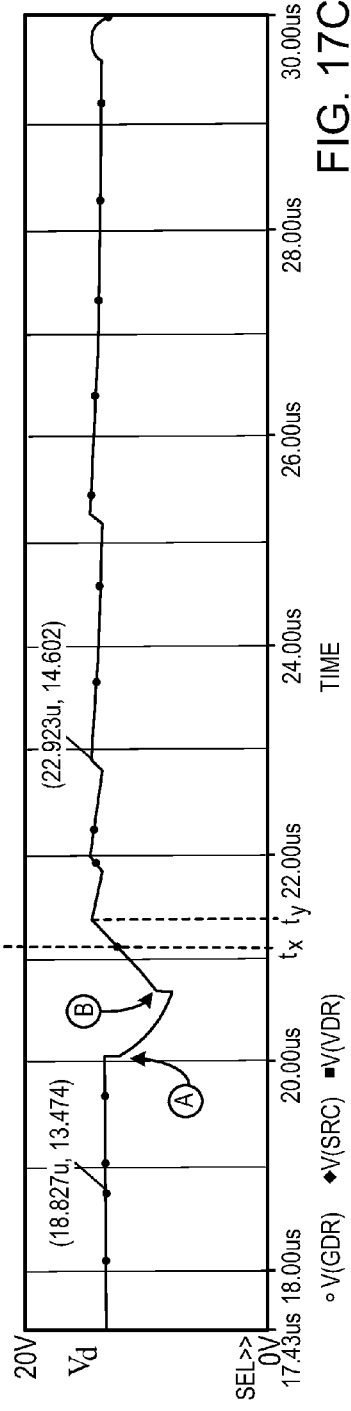

SUPPRESSING ELECTRICAL BUS TRANSIENTS IN ELECTRONIC CIRCUITRY

TECHNICAL FIELD

This invention relates to apparatus and methods for controlling transients on an electrical bus caused by changes in loading on the bus, more particularly the invention relates to controlling the turning off of a power device in order to control the transients on an electrical bus to which the power device is connected.

BACKGROUND

Connecting a load to, or disconnecting it from, a live source of electrical power, such as an electrical voltage bus, may cause undesirable transients on the bus. The transients may interfere with normal operation of other devices connected to the source or they may cause damage to one or more of the devices. For example, FIG. 1 shows an assembly 10a connected to receive energy from an input voltage source 20. The assembly and the input source may be connected by means of connectors 30a, 30b. The assembly comprises a load 14 and a bypass capacitor 12. The bypass capacitor 12 is connected across the load 14, primarily for load regulation; it also helps mitigate the effects of series impedances when source 20 and the load 14 are connected (e.g., source inductance Lb 15 and source resistance Rb 16; assembly inductance La 17 and assembly resistance Ra 18). When the assembly 10a is initially connected to the source 20, the discharged filter capacitor 12 will cause a reduction in the bus voltage Vb, the magnitude and duration of the reduction being a function of the size of the filter capacitor and the relative magnitudes of the series impedances. A transient reduction in Vb may impact operation of other devices (e.g., device 10b) that are connected to the power bus (e.g., by means of connectors 31a, 31b).

One way to manage the effects of connecting a load to a power bus is shown in FIG. 2. In the Figure, an assembly 40a comprises a MOSFET 44 that is connected in series between the input source 20 and the load 14 and bypass capacitor 12. When the assembly 40a is first connected to the bus (e.g., by means of connectors 30a, 30b), a FET Controller 42 in the assembly 40a controls the conductivity of the MOSFET 44 to control the initial charging of the bypass capacitor 12. By controlling the rate of charge of the capacitor 12, a reduction in the bus voltage Vb associated with the charging of the capacitor may be reduced. Once the capacitor is sufficiently charged, the FET Controller 42 may fully turn ON the MOSFET (i.e., bias it into a very low resistance state), thereby effectively connecting the capacitor 12 and the load 14 directly to the bus voltage Vb.

A sudden turning OFF of the switch 44 in the assembly 40a of FIG. 2, as might be effected by the FET Controller 42 in the event of a load 14 fault (such as a short circuit or other overload condition), may cause an uncontrolled transient increase in the voltage Vd at the drain of the MOSFET, and in the bus voltage Vb, owing to the energy stored in series parasitic inductances (e.g. inductances Lb 15, La 19, FIG. 2). The waveforms of FIG. 3, for example, show the effect of a sudden turning OFF of the MOSFET in response to a short circuit in the load 14 for the assembly of FIG. 2 comprising a generic MOSFET modeled with a 100 volt breakdown characteristic and having an ON resistance of $R_{dsON}$=5 milliohms; an input source voltage of 12 VDC; a total series inductance La+Lb=0.6 microhenry; and a total initial series resistance Ra+Rb=2 milliohms. In FIG. 3 the short circuit occurs at time t=0 and an overcurrent condition is detected (by a current sensor circuit, not shown in FIG. 2) at time t=2.5 microseconds, when the current Ia has increased to approximately 50 Amperes. In response to the overcurrent condition, the FET Controller rapidly turns the MOSFET OFF by sinking a 100 mA gate discharge current, Ig (FIG. 3D), from the gate of the MOSFET (the MOSFET gate-to-source voltage, Vgs, is shown in FIG. 3B). As shown in FIGS. 3A and 3C, the rapid discharging of the gate causes a rapid and essentially uncontrolled increase in the MOSFET drain voltage, Vd (FIG. 3C), so that, by time t1, Vd increases to approximately 100 Volts and the MOSFET enters avalanche breakdown. The rapid and uncontrolled transient increase in the voltage Vd, and bus voltage Vb, may cause failure of voltage-sensitive components, such as integrated circuits, in this assembly or in other assemblies that receive the bus voltage (e.g., assembly 40b of FIG. 2), or it may damage the MOSFET 44.

As shown in FIG. 4, one way to control the peak magnitude of a transient increase in the voltage Vd is to install a voltage limiting circuit or device (e.g., a Transzorb 46 or a Metal-oxide varistor (not shown)) at the input of the assembly 40, and preferably close to the drain of the MOSFET 44. Apparatus and methods for active overvoltage protection are also described in Bruckmann et al, U.S. Pat. No. 6,407,937, "Active Overvoltage Protection Apparatus for a Bidirectional Power Switch in Common Collector Mode", and in Kelly, U.S. Pat. No. 5,401,996, "Overvoltage Protected Semiconductor Switch."

As used herein, the term "hot swap" refers to connecting a load to, or disconnecting it from, a live source of electrical power, such as an electrical voltage bus. In hot swap applications, care must be taken to ensure that hot swapping one assembly does not affect other assemblies on the bus, e.g., by causing the voltage on the bus to increase or decrease to an extent that would impact the operation of another assembly or cause damage. Hot swapping may refer to physically connecting or disconnecting an assembly (e.g., plugging an electronic assembly into, or unplugging an electrical assembly from, a connector; using a mechanically actuated switch to connect or disconnect the assembly) or it may refer to electronically connecting or disconnecting the assembly (e.g., by means of a controlled semiconductor device, such as a MOSFET switch).

Switching behavior, operating regions and gate drive characteristics of MOSFET transistors are described in AN-1084, "Power MOSFET Basics"; in AN-937, "Gate Drive Characteristics and Requirements for Power MOSFETs"; and in AN-947, "Understanding HEXFET Switching Performance"; all by International Rectifier Corporation, El Segundo, Calif., USA. MOSFET terminology is illustrated with reference to FIG. 16, which shows an example of current-voltage characteristics for an N-channel enhancement-mode MOSFET. Each of the curves labeled 1, 2, 3 and 4 show current-voltage characteristics at different values of gate-to-source voltage Vgs. The region to the right of the dashed line 300 is conventionally referred to as the "saturation" region of the MOSFET; the region to the left of the dashed line 300 is conventionally referred to as the "ohmic", "linear" or "triode" region of the MOSFET. In the "linear" region the resistance of the MOSFET approaches a relatively very low value that is relatively insensitive to variations in Vgs; when operating in the saturation region, however, the MOSFET drain current is relatively very sensitive to changes in Vgs. As used herein with reference to a MOSFET, the term "ON" refers to operation of the MOSFET deep in the "linear" region—e.g., in the region labeled 302 in FIG. 16. When ON, the "ON resistance"

($R_{dsON}$) of a MOSFET is typically characterized by the manufacturer at a specific combination of Vgs and drain current.

SUMMARY

In general, in one aspect, an apparatus includes transient-suppression controller for turning off the conductivity-controlled device. The conductivity-controlled device may include a control terminal and a first terminal for connection to a source with a connection characterized by a connection impedance. The conductivity-controlled device may be characterized by a control region wherein the rate-of-change of voltage at the first terminal is a function of a signal at the control terminal. The transient-suppression controller may be adapted to provide to the control terminal (a) a first control signal to transition the conductivity-controlled device from a high conductivity state towards a non-conductive state, and (b) a second control signal when the conductivity-controlled device is at or near a predetermined area of the control region. The second control signal may be smaller in magnitude than the first control signal and scaled to limit the rate-of-change of voltage at the first terminal as the conductivity-controlled device transitions to a non-conductive state.

In general, in another aspect, an apparatus includes transient-suppression controller for turning off a conductivity-controlled device having a control terminal and a first terminal for connection to a power source characterized by a connection impedance. The conductivity-controlled device may be characterized by a control region wherein the rate-of-change of voltage at the first terminal is a function of a signal at the control terminal. The transient-suppression controller may be adapted for connection to the control terminal of the conductivity-controlled device to provide (a) a first control signal to transition the conductivity-controlled device from a high conductivity state towards a non-conductive state, and (b) a second control signal when the conductivity-controlled device is at or near a predetermined area of the control region. The second control signal may be smaller in magnitude than the first control signal and scaled to limit the rate-of-change of voltage at the first terminal as the conductivity-controlled device transitions to a non-conductive state.

In general, in another aspect a method of turning off of a conductivity-controlled device is provided. The conductivity-controlled device may have a control terminal and a first terminal for connection to a power source being characterized by a connection impedance. The conductivity-controlled device may be characterized by a control region wherein the rate-of-change of voltage at the first terminal is a function of a signal at the control terminal. The method may include providing a first control signal to the control terminal to transition the device from a high conductivity state towards a non-conductive state. A second control signal may be provided to the control terminal when the conductivity-controlled device is at or near a predetermined area of the control region. The second control signal may be scaled to be of a magnitude that is smaller than the first control signal and that limits the rate-of-change of voltage at the first terminal as the conductivity-controlled device transitions to a non-conductive state.

Implementations of the method or apparatus may include one or more of the following features. The conductivity-controlled device may be a transistor. The device may be a MOSFET transistor and the control terminal may be the gate terminal of the MOSFET. The first terminal may be either the drain terminal or the source terminal of the MOSFET. The first control signal and the second control signal may be currents. The transient-suppression controller may be configured to provide the first control signal in the form of a first current delivered to the gate terminal when the magnitude of the current flowing in the first terminal reaches a pre-determined current threshold. The transient-suppression controller may be configured to provide the second control signal in the form of a second current delivered to the gate terminal in response to a voltage at the first terminal. The MOSFET may be an N-channel enhancement-mode device with the drain terminal configured as the first terminal and the first and second control current signals sink current out of the gate. The controller may be configured to compare the voltage at the first terminal to a pre-determined first threshold value. The controller may be configured to compare an incremental change in the voltage at the first terminal to a pre-determined first threshold value. The apparatus transient-suppression controller may be configured to: (c) provide a third control signal to the control terminal when a predetermined threshold condition is detected. The third control signal may be smaller in magnitude than the second control signal and scaled to limit the rate of change of voltage at the first terminal as the conductivity-controlled device transitions to a non-conductive state. The threshold condition may be a rate of energy accumulation in the connection impedance being at or near a threshold. The rate of change of energy accumulation in the connection impedance may be zero or negative. The conductivity-controlled device may be a MOSFET, the control terminal may be the gate terminal of the MOSFET, and the transient-suppression controller may be configured to: sense the voltage at the first terminal. The transient-suppression controller may detect when the voltage at the first terminal is at or near the second threshold, and, in response, provide the third control signal in the form of a third current delivered to the gate terminal. The detection may include comparing the voltage at the first terminal to a pre-determined second threshold value. The pre-determined second threshold value may be equal to or greater than a voltage delivered by the voltage source. The detection may include comparing the voltage at the first terminal to an adaptive second threshold value. The transient-suppression controller may be configured to generate an adaptive second threshold value by averaging the voltage at the first terminal.

Implementations of the apparatus or method may include one or more of the following features. The transient-suppression controller may be adapted to control the second control signal to maintain the voltage at the first terminal at a magnitude that is substantially equal to a setpoint value as the conductivity-controlled device transitions to a non-conductive state. The transient-suppression controller may be configured to sense the magnitude of a current flowing in the first terminal and provide the first control signal in response to the magnitude of the current flowing in the first terminal meeting a pre-determined current threshold. The transient-suppression controller may be configured to sense the voltage at the first terminal and provide the second control signal in response to the voltage at the first terminal meeting a first threshold. The first threshold may be a predetermined voltage level against which a magnitude of the voltage at the first terminal is compared. The first threshold may be an incremental voltage change against which an incremental change in the voltage at the first terminal is compared. The transient-suppression controller may be configured to control the voltage at the first terminal by adjusting the magnitude of the second control signal to reduce a difference between the voltage at the first terminal and the setpoint value. The setpoint value may be a constant. The setpoint value may be adjusted as a function of the average value of the voltage at the first terminal.

Implementations of the method or apparatus may include one or more of the following features. Providing the first control signal may include sensing the magnitude of a current flowing in the first terminal, and providing the first control signal in response to the magnitude of the current flowing in the first terminal meeting a pre-determined current threshold. Providing the second control signal may include sensing the voltage at the first terminal, detecting a condition in which the voltage at the first terminal meets a first threshold, and providing the second control signal in response to the detecting. The detecting may include providing a pre-determined first threshold value, and comparing the voltage at the first terminal to the pre-determined first threshold value. The detecting may include providing a pre-determined first threshold value, sensing an incremental change in the voltage at the first terminal, and comparing the incremental change to the pre-determined first threshold value. A third control signal may be provided to the control terminal for a predetermined threshold condition. The third control signal may be scaled to be of a magnitude that is smaller than the second control signal and that limits the rate-of-change of voltage at the first terminal as the conductivity-controlled device transitions to a non-conductive state. The predetermined threshold condition may include a rate of energy accumulation in the connection impedance being at or near a threshold. The rate of change of energy accumulation in the connection impedance may be zero or negative. Providing the third control signal may include sensing the voltage at the first terminal, detecting when the voltage at the first terminal is at or near a second threshold, and providing the third control signal in response to the detecting. The detecting may include using a pre-determined value for the second threshold, and comparing the voltage at the first terminal to the pre-determined value. The pre-determined second threshold value may be equal to or greater than a voltage delivered by the voltage source. The detecting may include generating an adaptive second threshold voltage for the second threshold, and comparing the voltage at the first terminal to the adaptive second threshold value. Generating the adaptive threshold voltage may include averaging the voltage at the first terminal. A setpoint value related to a desired voltage at the first terminal may be provided and the second control signal may be controlled to influence the voltage at the first terminal toward a predetermined relationship with the setpoint value as the conductivity-controlled device transitions to a non-conductive state. The first and second control signals may be provided as currents. The first control signal may be provided as a current in response to detecting when the magnitude of a current flowing in the first terminal reaches a pre-determined current threshold. Providing the second control signal may include sensing the voltage at the first terminal, detecting when the voltage at the first terminal is at or near the first threshold, and, in response, providing the second control signal in the form of a second current delivered to the gate terminal. The detecting may include providing a pre-determined first threshold value, and, comparing the voltage at the first terminal to the pre-determined first threshold value. The detecting may include providing a pre-determined first threshold value, sensing an incremental change in the voltage at the first terminal, and, comparing the incremental change to the pre-determined first threshold value. The controlling may include measuring a difference between the voltage at the first terminal and the setpoint value, and, controlling the magnitude of the second control current to reduce the difference between the voltage at the first terminal and the setpoint value. The setpoint value may be provided as a constant value. Providing the setpoint value may include measuring an averaged value of the voltage at the first terminal, and, generating an adaptive setpoint value based upon the averaged value. An N-channel MOSFET enhancement-mode device may be provided for use as the conductivity-controlled device. The drain terminal of the MOSFET may be connected as the first terminal, the gate terminal of the MOSFET may be connected as the control terminal, and the first and second control signals may include sinking current out of the gate terminal. A third control signal may be provided in the form of a current drawn out of the gate terminal for a predetermined threshold condition. The third control signal may be scaled to be of a magnitude that is smaller than the second control signal and that limits the rate-of-change of voltage at the drain terminal as the MOSFET transitions to a non-conductive state.

DESCRIPTION OF DRAWINGS

FIGS. 6A through 6E show operating waveforms for the apparatus of FIG. 5.

FIGS. 8A through 8C show a portion of some of the waveforms of FIG. 7.

FIGS. 17A through 17C show waveforms for a TSC according to the present disclosure.

Like reference symbols in the various drawings indicate like elements.

DETAILED DESCRIPTION

Figure 1:
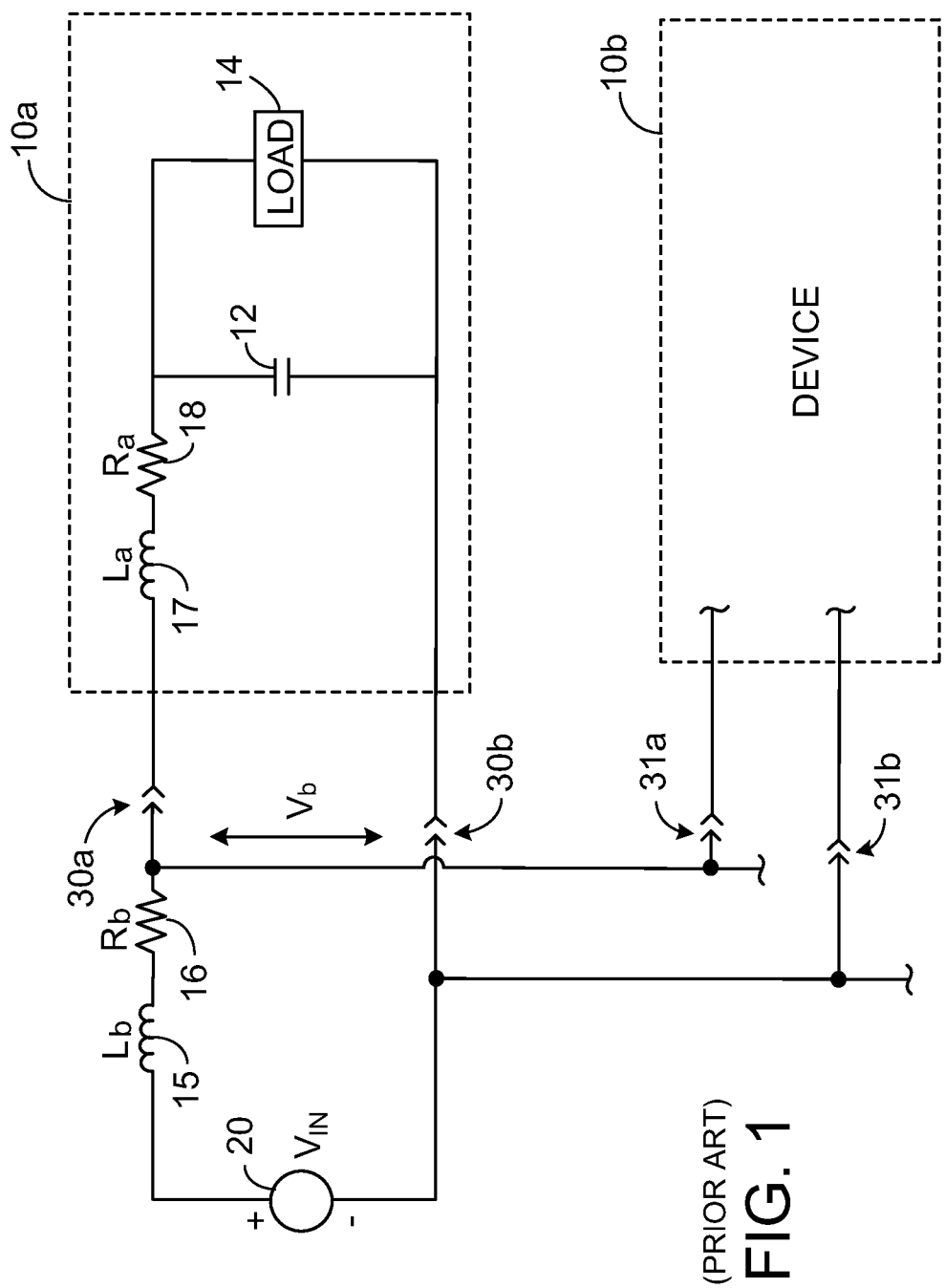
FIG. 1 shows an energy-consuming device connected to a source.
Figure 2:
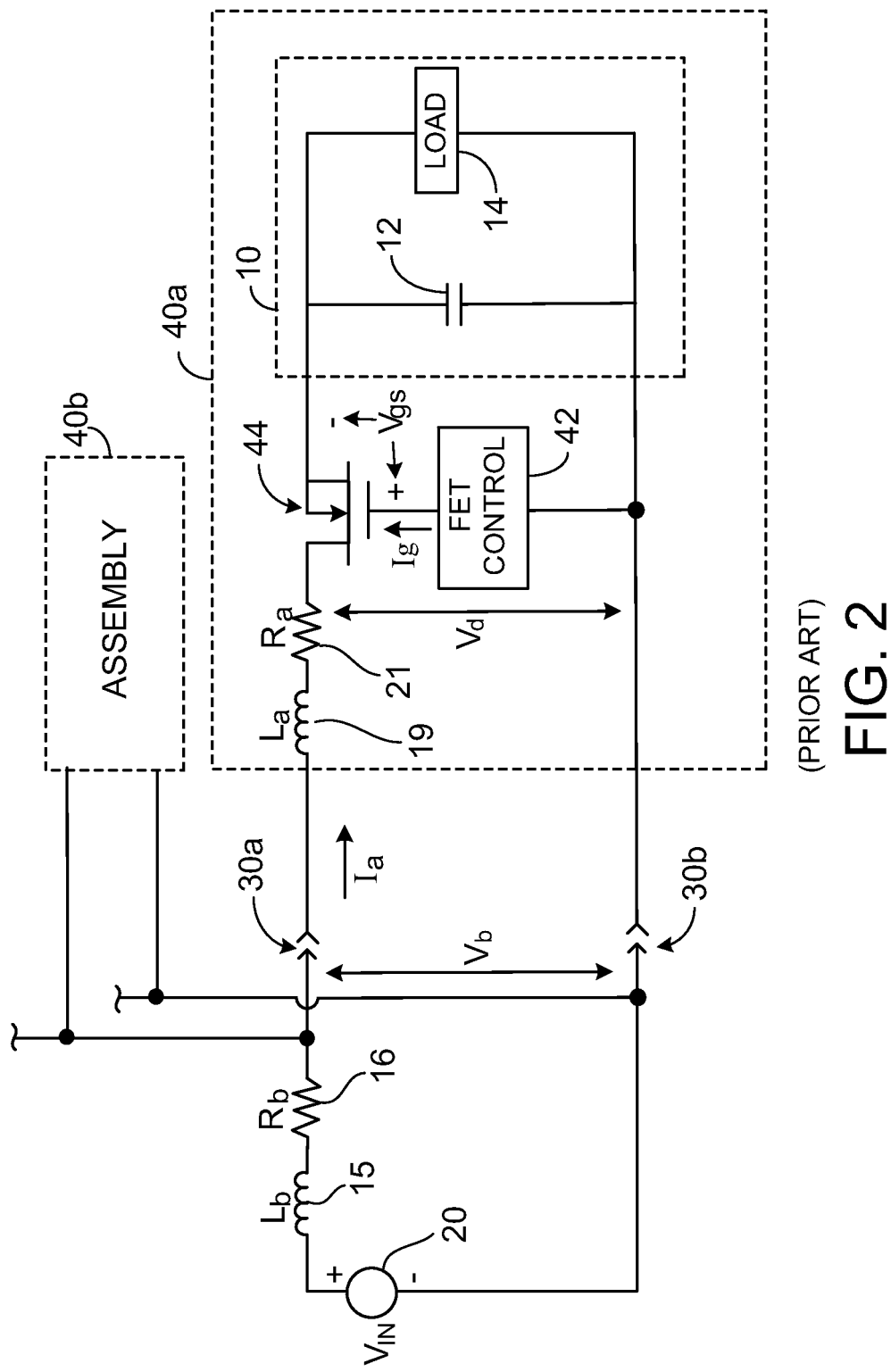
FIG. 2 shows an assembly comprising a current-controlled device connected between an energy-consuming device and a source.
Figure 3:
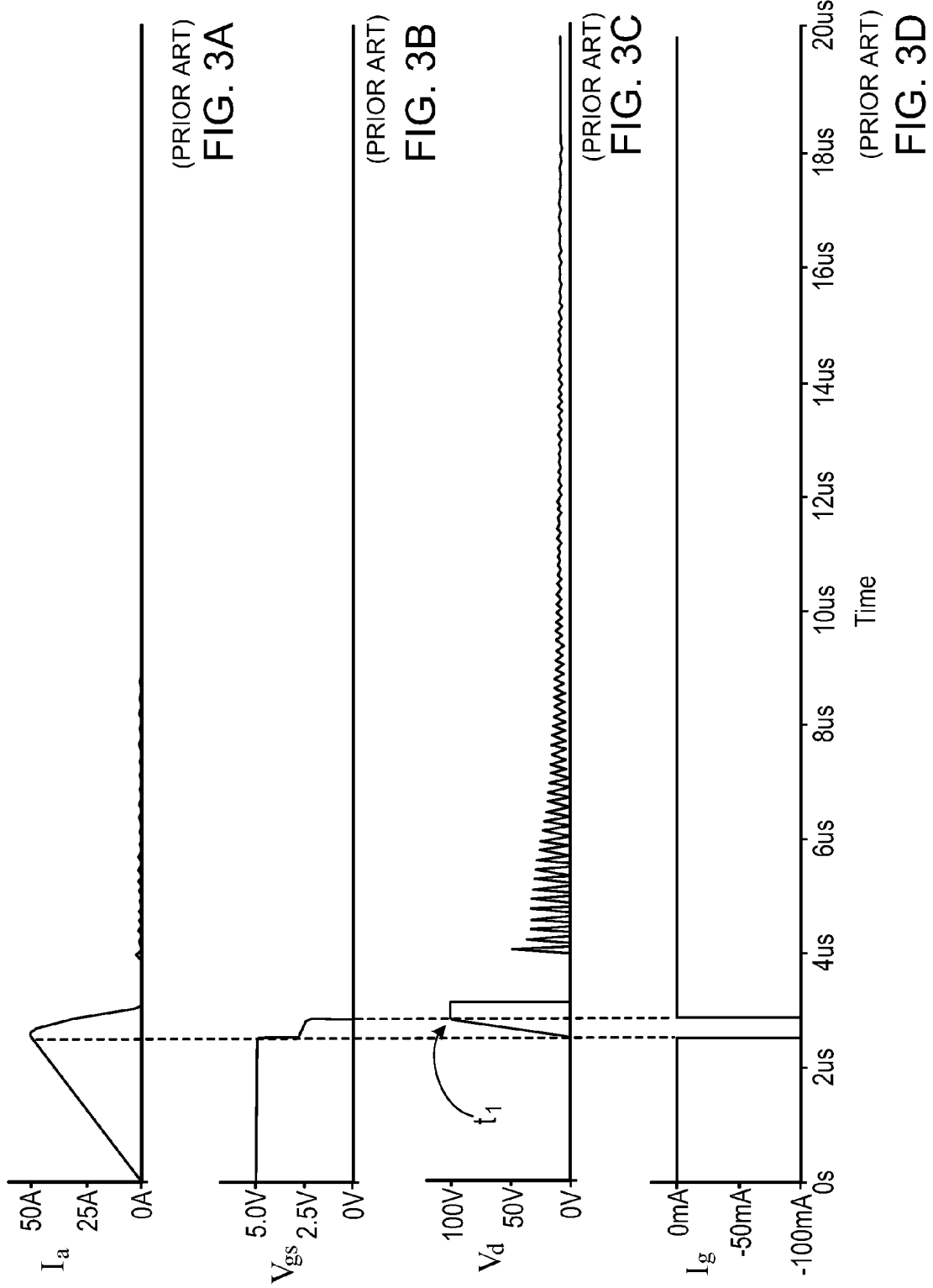
FIGS. 3A-3D show waveforms for the apparatus of FIG. 2.
Figure 4:
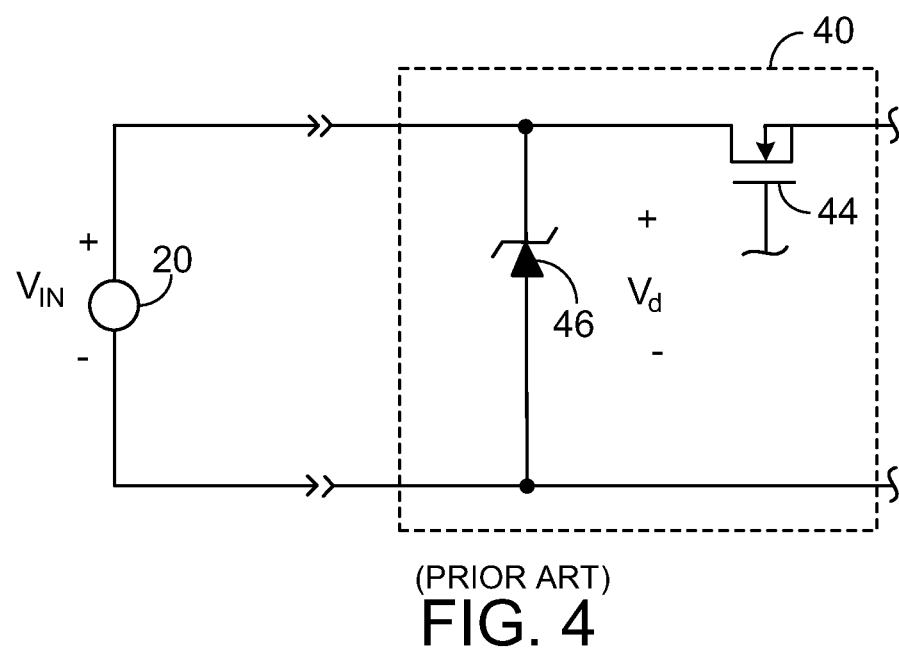
FIG. 4 shows a voltage-limiting device connected across the input of an assembly of the kind shown in FIG. 2.
Figure 5:
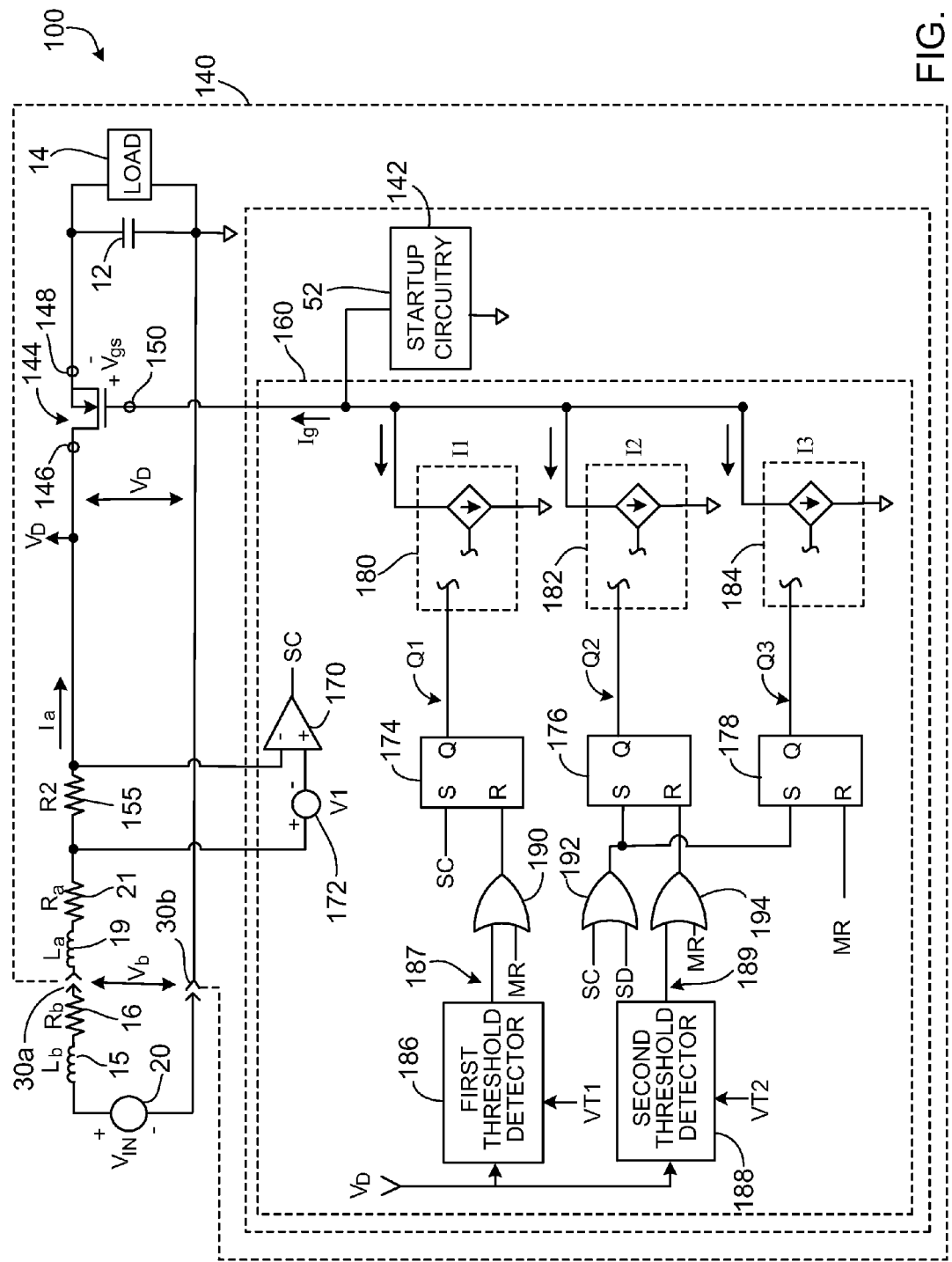
FIG. 5 shows apparatus comprising an embodiment of a transient suppression controller ("TSC") according to the present disclosure.

FIG. 5 shows apparatus 100 comprising an electronic assembly 140 connected to an input source 20. The assembly 140 comprises a load, which may be an electronic circuit; a bypass capacitor 12 connected across the load; a MOSFET 144, the MOSFET comprising a drain terminal 146, a gate terminal 150 and a source terminal 148; and a FET Controller 142. The FET Controller 142 comprises an embodiment of a Transient Suppression Controller 160 ("TSC") according to the present invention. Assembly 140 may be connected to a voltage bus, indicated in FIG. 5 by bus voltage Vb, by means of connectors (e.g., connectors 30a, 30b). Assembly 140 may be one of several assemblies that are connected to the voltage bus (not shown in FIG. 5, but illustrated in FIG. 2).

As discussed earlier, with reference to FIG. 2, use of the MOSFET may enable hot-swapping of the assemblies to be done safely. When assembly 140 is first connected to the input source 20 (e.g., by means of connectors 30a, 30b) startup circuitry 52, in FET Controller 142, may control the conductivity of the MOSFET 144 in order to control the initial charging of the bypass capacitor 12. Once the capacitor is sufficiently charged, the startup circuitry 52 may increase the gate-to-source voltage of the MOSFET, Vgs, to a relatively high value in order to bias the MOSFET into a relatively low resistance state, thereby minimizing the voltage drop across, and the power dissipated, in the MOSFET. Thus, under "normal" operating conditions the MOSFET may be considered to be essentially a short circuit.

FIGS. 6, 7 and 8 show waveforms for a TSC 160, of the kind shown in FIG. 5, operating in response to a short circuit in load 14. FIG. 7 is an expanded view of a portion of FIG. 6; FIG. 8 is an expanded view of a portion of FIG. 7. The components and component values used in the illustrated example are: MOSFET 144 is a GWS12N30 device, manufactured by Great Wall Semiconductor, Tempe, Ariz., USA; Vin=12 VDC; La+Lb=0.6 microhenry; the initial series resistance Ra+Rb=2 milliohms; the sense resistance R2=1 milliohm; and the MOSFET's ON resistance $R_{dsON}$=5 milliohms.

Figure 7A:
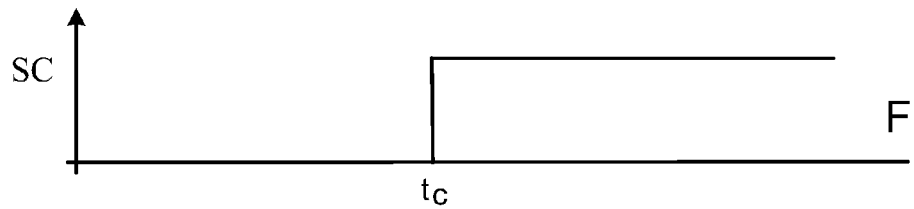
FIGS. 7A through 7E show a portion of the waveforms of FIG. 6.
Figure 7B:
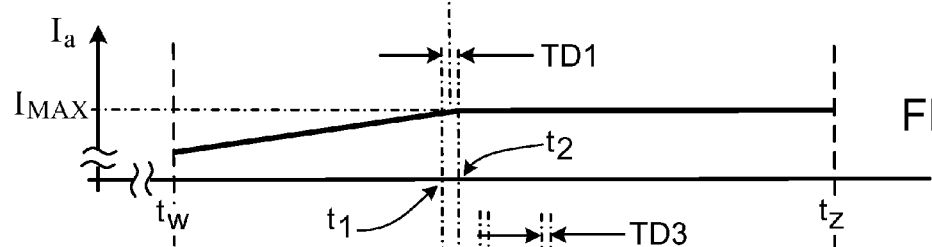

Referring to FIG. 6A, the load 14 short circuits at time t=0. Because the gate voltage, Vgs (FIGS. 6C and 7B), is relatively high at time t=0, the MOSFET 144 is in a low resistance state and the shorted load 14 causes the voltage, Vd, to drop to essentially zero volts (FIG. 6D). Following t=0, the load current, Ia, rises rapidly, limited only by the series impedances between the input source and the load (e.g., Lb 15, Rb 16, La 19, Ra 21, current sense resistor R2 155, and the relatively low resistance of the MOSFET). The magnitude of the current Ia is monitored by a current sense circuit comprising comparator 170, sense resistor R2 155 and a reference voltage source 172, of value V1. The values of V1 and R2 set a maximum current threshold, Imax=V1/R2, for the current detector. At time t1 the current Ia equals Imax. A short time later, at time tc (corresponding to the propagation delay in comparator 170), the signal SC at the output of comparator 170 goes high (FIGS. 6A, 7A). The signal SC is logically connected to the SET input of three Set-Reset ("S-R") flip flops 174, 176 178. A short time (corresponding to the propagation delay in the flip-flops and any associated logic gates) after the signal SC goes high, the Q outputs of the first, second and third Set-Reset ("S-R") flip-flops 174, 176 178 go high.

Each of the outputs, Q1, Q2 and Q3, of the S-R flip-flops is connected to a control input of a respective controlled current source 180, 182, 184. When Q1 is low, first controlled current source 180 sinks zero current; when Q1 is high, first controlled current source 180 sinks a current I1 in the direction shown by the arrow in FIG. 5. Likewise, the second controlled current source 182 will sink a current I2 when Q2 is high, and sink zero current when Q2 is low; and the third controlled current source 184 will sink a current I3 when Q3 is high, and sink zero current when Q3 is low. In the example of FIGS. 5 and 6, I1=100 mA; I2=10 mA; and I3=0.25 mA. A short time (corresponding to the propagation delay in the controlled current sources 180, 182, 184) after the Q outputs of the three S-R flip-flops 174, 176, 178 go high, at time t2, the three controlled current sources begin to sink a total current equal to −Ig=(I1+I2+I3)=110.25 mA, out of the gate 150 of the MOSFET 144 (FIGS. 7E and 8C). As shown in FIG. 7, the propagation delays result in a total overcurrent detection delay, TD1, between the time, t1, when Ia=Imax, and time t2, when gate current begins to flow.

Figure 7C:
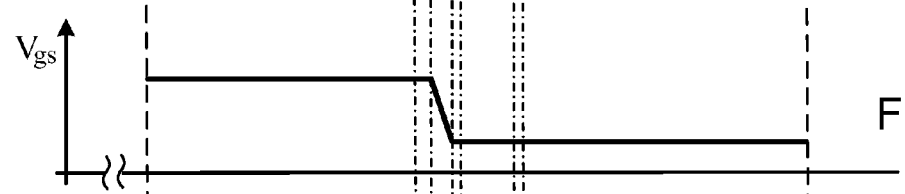
Figure 16:
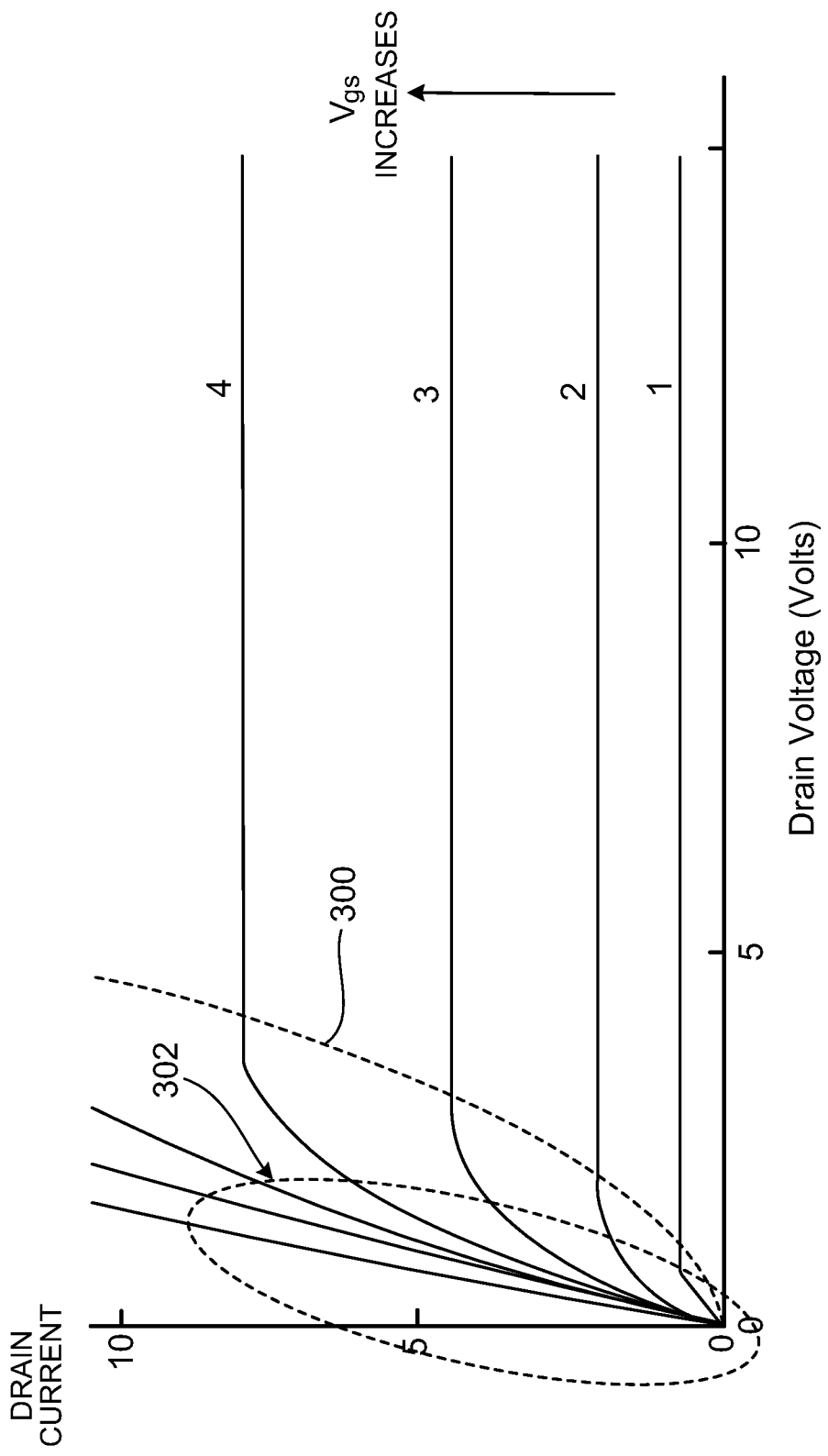
FIG. 16 shows the current-voltage characteristics and operating regions of a MOSFET transistor.

Between times t2 and t3 the relatively large gate current causes a relatively rapid decline in the gate voltage, Vgs (FIGS. 7C, 8A). Throughout the referenced interval, however, Vgs remains sufficiently high so that the conductivity of the MOSFET remains relatively high and the increase in the drain voltage, Vd, is relatively small. At about time t3, however, Vgs has fallen to a level at which it is just sufficient to support the drain current Ia(t3.) Following time t3, the gate voltage "plateaus" (FIG. 8A) and Miller effect feedback causes the rate-of-change of the drain voltage, Vd, to be approximately equal to:

$$d(Vd)/dt = -Ig/Cdg \qquad (1)$$

where Ig is the gate current and Cdg is the drain-to-gate capacitance of the MOSFET. The MOSFET is in an operating region in which the rate-of-change of the drain-to-source voltage of the MOSFET, and hence the voltage Vd, is dependent upon the value of the gate current Ig. We will define, and refer herein, to this operating region as the "control region" of the MOSFET. The "control region" may be within the saturation region of the MOSFET, as previously described with reference to FIG. 16. Thus, as indicated in FIGS. 7D and 8B, the rate-of-change of the drain voltage following time t3 will be approximately equal to:

$$d(Vd)/dt = -(I1+I2+I3)/Cdg = -110.25 \text{ mA}/Cdg. \qquad (2)$$

A first threshold detector 186 (FIG. 5) is configured to detect when the increase in Vd following time t3 reaches a first threshold value VT1 (e.g., VT1=2 Volts). When the output of the first threshold detector goes high it resets the first flip-flop 174. As a result, Q1 goes low, the first controlled current source 180 is turned off, and the gate current is reduced to a value Ig=−(I2+I3)=−10.25 mA. FIG. 8B shows Vd crossing the first threshold at time t4. Because of propagation delays (shown in FIGS. 7 and 8 as the delay period TD2) in the first threshold detector 186, the first controlled current source 180, the first flip-flop 174, and gate 190, the reduction in gate current is delayed until time t5 (FIG. 8C). The delay period TD2 results in an overshoot in Vd above VT1.

Figure 7D:
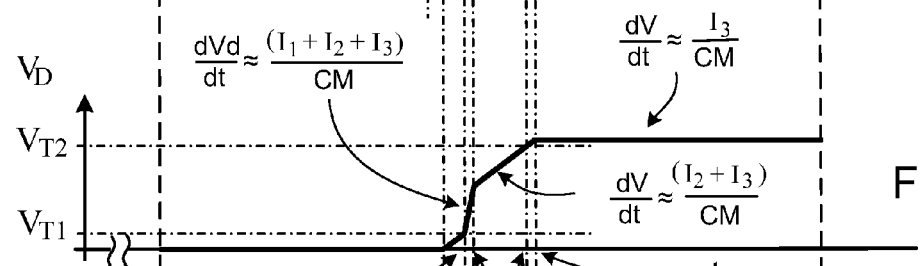
Figure 7E:
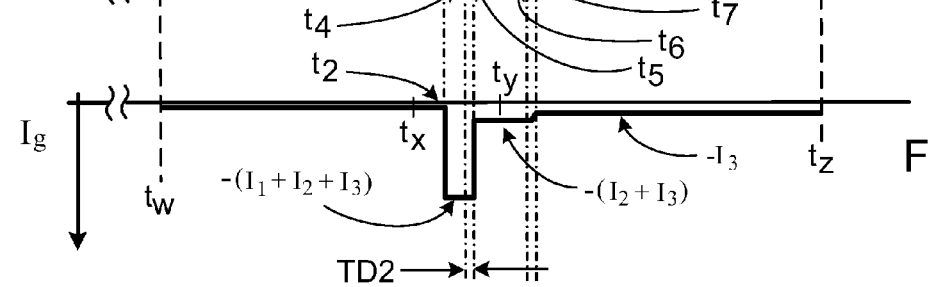

As shown in FIGS. 7D and 8B, the reduction in gate current after time t5 will result in a reduction in the rate-of-change of Vd, as indicated by Equation 1. A second threshold detector 188 (FIG. 5) is configured to detect when the increase in Vd, following time t5, reaches a second threshold value VT2 (e.g., VT2=Vin=12 Volts). When the output of the second threshold detector goes high it resets the second flip-flop 176. As a result, Q2 goes low, the second controlled current source 182 is turned off, and the gate current is reduced to a value Ig=−I3=−0.25 mA. FIG. 7D shows Vd crossing the second threshold at time t6. Because of propagation delays (shown in FIG. 7 as the delay period TD3) in the second threshold detector 188, the second controlled current source 182, the second flip-flop 176, and gate 194, however, the reduction in gate current is delayed until time t7 (FIG. 7D). The delay period TD3 results in an overshoot in Vd above VT2.

Figure 10:
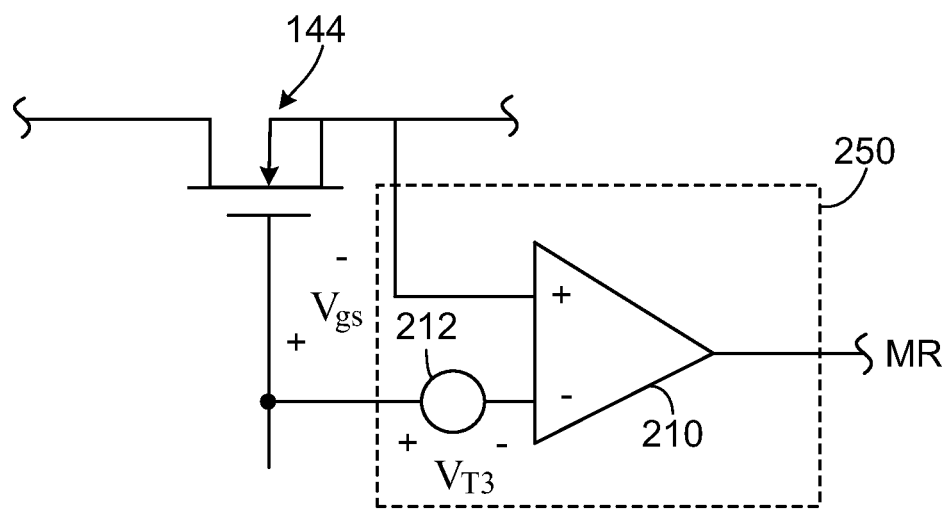
FIG. 10 shows a retry circuit for use in a TSC according to the present disclosure.

As shown in FIGS. 6D and 7D, the further reduction in gate current after time t6 will cause a further reduction in the rate-of-change of Vd, resulting in a relatively slow and controlled increase in Vd. At time t7 (FIG. 6B) the current Ia goes to zero and the drain voltage is at a maximum value. Thereafter, the continued flow of gate current discharges the gate, turning the MOSFET OFF. With the MOSFET OFF, the voltage Vd declines to a value equal to Vin. After time t7 the current Ig may be allowed to flow continuously to hold the MOSFET OFF, or a retry mechanism may be employed wherein the MR signal (FIG. 5) is asserted to reset the three flip-flops. If a fault condition still exists following the reset, the sequence of events described above will reoccur; if the fault condition has cleared, the load 14 may resume normal operation. An example of a retry circuit 250 is shown in FIG. 10. In the Figure comparator 210 compares the gate-to-source voltage, Vgs, of the MOSFET to a threshold voltage VT3 212, the threshold voltage being selected to be low enough (e.g. 0.5 V) to indicate that the MOSFET is turned OFF. When Vgs drops below VT3 the MR signal is asserted to initiate a retry process.

Preferably, the TSC features rapid fault detection and controlled MOSFET turn off which in some applications may eliminate the need for transient suppression components. A three-phase TSC may be operated in accordance with the following method:

Upon sensing a fault condition (e.g., an overcurrent condition) a first response phase is initiated by providing a first, relatively high, gate discharge current, Ig, as a means of rapidly bringing the MOSFET 144 into the "control region", as that term is defined herein. Speed is essential in the first phase, as a delayed response will allow for a further increase in the overcurrent. As noted earlier, once the MOSFET enters the control region the large gate discharge current will enable a fast rate-of-change of drain voltage (e.g., 200 volt/microsecond). It is therefore important that entry of the MOSFET into its control region be detected promptly and that the first response phase be terminated promptly following that detection. If termination of this phase is delayed, due, e.g., to delays in detecting that the MOSFET has entered the control region and/or to propagation delays in control circuitry, the drain voltage may rise to an undesirable, and potentially damaging value. There are a number of ways to detect when the first phase is to be terminated. One way, discussed earlier, is to monitor and detect an initial increase in the drain voltage of the MOSFET.

Following the first phase, a second phase is initiated by reducing the gate current to a second gate discharge current value which is sufficiently large to enable the drain voltage to increase relatively rapidly to a second threshold value, but not so large that the rate-of-change of the drain voltage precludes terminating the phase with relatively little overshoot. The second threshold voltage may be selected based upon safe operating voltage ratings of devices connected to the bus (e.g., loads 14; integrated circuits contained within loads) and the anticipated peak voltage (e.g., the value of Vd at time t7, FIG. 6D) to which a load or device may be exposed. In some applications, the second threshold voltage may be set to a value that is equal to or greater than the average value (Vin-avg) of the input source voltage (Vin), provided that the selected value is consistent with safe operation of loads that are connected elsewhere on the bus. It is desirable that the rate-of-change of the drain voltage during this phase be relatively fast, however it must not be so fast that significant overshoot can occur during circuit propagation delays at the end of the phase. There are a number of ways to detect when the second phase is to be terminated. One way, discussed earlier, is to monitor and detect when the drain voltage of the MOSFET reaches a pre-determined value. As discussed below, setting the pre-determined value to be greater than or equal to the input source voltage may result in a relative reduction in both accumulated energy in series inductances and in current overshoot.

Following the second phase, a third phase is initiated by reducing the gate current to a third, relatively low, value, to maintain the rate-of-change of voltage at a controlled low level. The third phase provides for a slow, controlled and moderate increase in the drain voltage that allows for the stored energy associated with the fault condition, e.g. energy stored in the series inductance, to be dissipated in the MOSFET and other circuit resistances or channeled toward the load. During this phase the current in the MOSFET declines to zero.

Figure 11A:
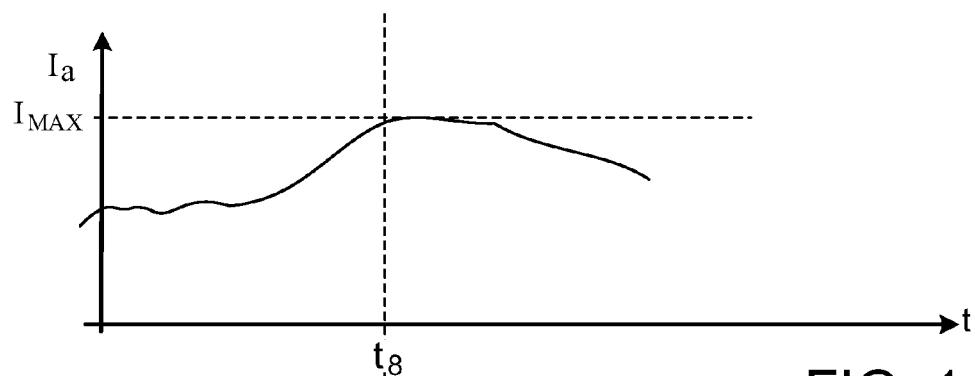
FIGS. 11A through 11C show waveforms for the apparatus of FIG. 5.
Figure 11B:
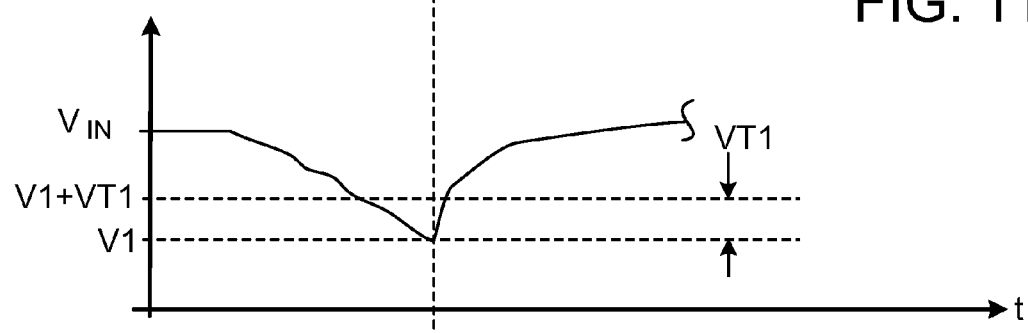
Figure 11C:
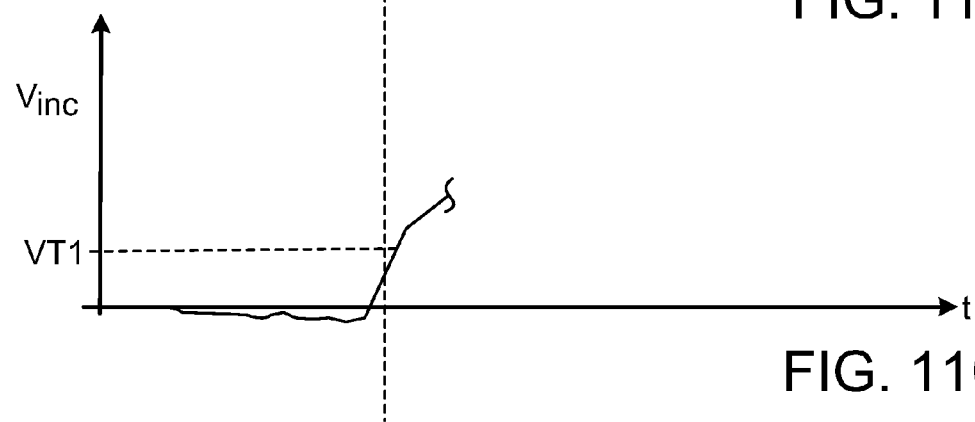

The "shorted load" example of FIGS. 6, 7 and 8 assumed that Vd was essentially zero volts until the MOSFET entered the control region. As a practical matter, Vd may be not be zero when a fault condition occurs. FIG. 11, for example, shows a condition in which an increasing current, Ia, is accompanied by decreasing Vd. At time t8, when Vd=V1, a TSC response is initiated when Ia increases above the Imax threshold. As discussed above, the first response phase of the TSC must be terminated promptly upon the MOSFET entering its control region. With reference to FIG. 11, one way to detect when the MOSFET has entered its control region is to detect when, after time t8, the voltage Vd has increased by an incremental threshold amount VT1 (e.g. VT1=2 Volts), i.e., when Vd=V1+VT1.

Figure 9:
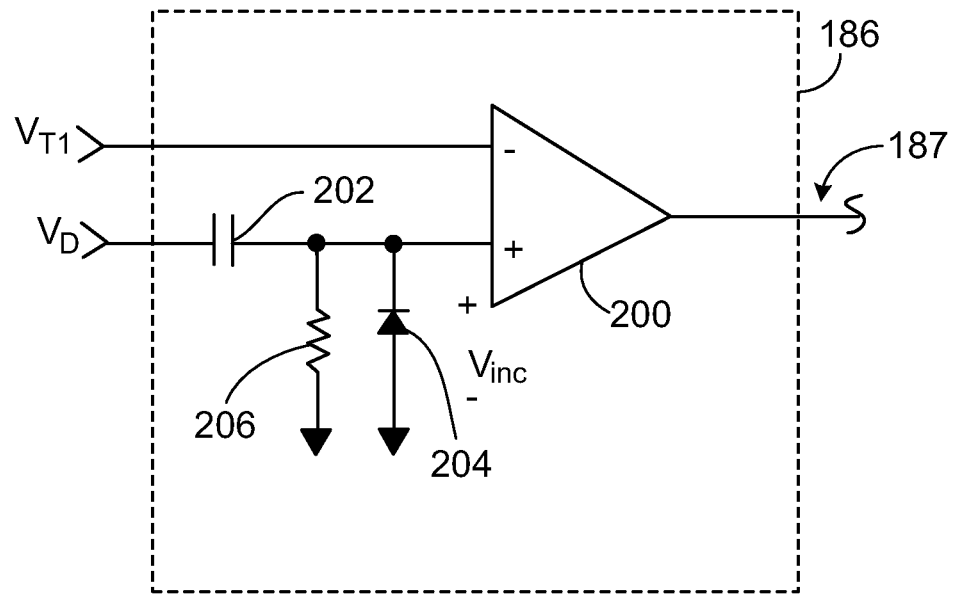
FIG. 9 shows a first threshold detector for use in a TSC according to the present disclosure.

FIG. 9 shows one way to configure a first threshold detector 186 to detect an incremental change in Vd. In the Figure, the threshold detector 186 comprises a comparator 200, a capacitor 202, a diode 204 and a resistor 206. The negative input of the comparator receives the incremental threshold value, VT1. The positive input of the comparator receives the output of a high pass filter composed of capacitor 202 and resistor 206, which filters out both the steady-state value of, and relatively slow variations in, Vd. Diode 204 clamps negative variations in Vd. Referring to FIG. 11, the decrease in Vd prior to time t8 is clamped by the diode 204. However, the increase in voltage following time t8 is passed through to Vinc, enabling the comparator to sense when Vd has incrementally changed by the amount VT1.

Figure 12:
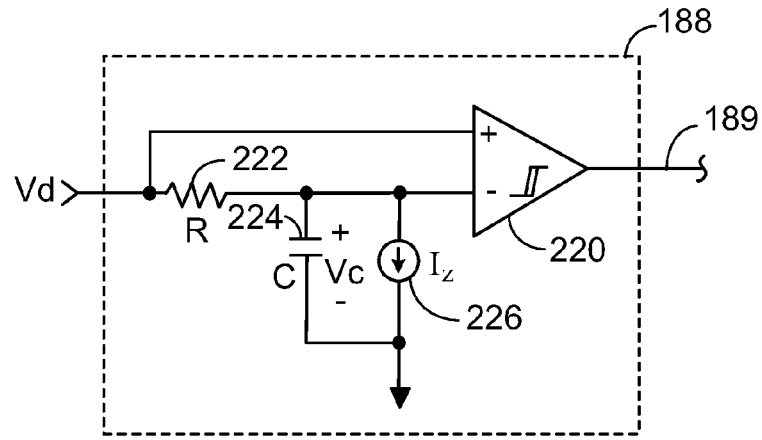
FIG. 12 shows a second threshold detector for use in a TSC according to the present disclosure.

The second threshold detector 188 described earlier compared Vd to a fixed threshold, VT2. Because the nominal value of the voltage Vin may be different in different applications (e.g., 5V, 12V), and may also vary with time and other factors (e.g., from 3V to 6V; from 10V to 14V), it may be desirable to use a second threshold detector having an adaptive threshold. One such adaptive second threshold detector 188, shown in the block diagram of FIG. 12, comprises a comparator with hysteresis 220, a resistor 222, a capacitor 224, and a current source 26 delivering a current Iz. The time constant defined by R and C is long relative to the time over which a TSC response may occur. For example, if a TSC response takes on the order of 10 microseconds, the RC time constant may be set to 100 microseconds or more.

In operation, the capacitor 224 will be charged to a nominal voltage, Vc, that is essentially equal to Vavg−Iz*R, where Vavg is the average value of the voltage Vd (which, in the apparatus of FIG. 5, may be essentially equal to the average value of the input source voltage Vin). If the current source were not present, Vc would charge to Vavg and normal fluctuations in Vd (e.g., ripple and noise) about Vavg would cause undesirable toggling of the comparator output 189; by using the current source, the offset voltage, Iz*R, may set to a value that is greater than the expected normal fluctuations, thereby preventing the comparator from responding. Under normal operating conditions the comparator output 189 will be high, owing to the offset voltage across R. However, when a fault occurs and Vd decreases, the comparator output will go low and not return to a high state until Vd rises above Vc. Because Vc is a function of the average value of Vd, the threshold in the comparator circuit of FIG. 12 will adaptively vary with the average value of the input voltage.

Figure 13:
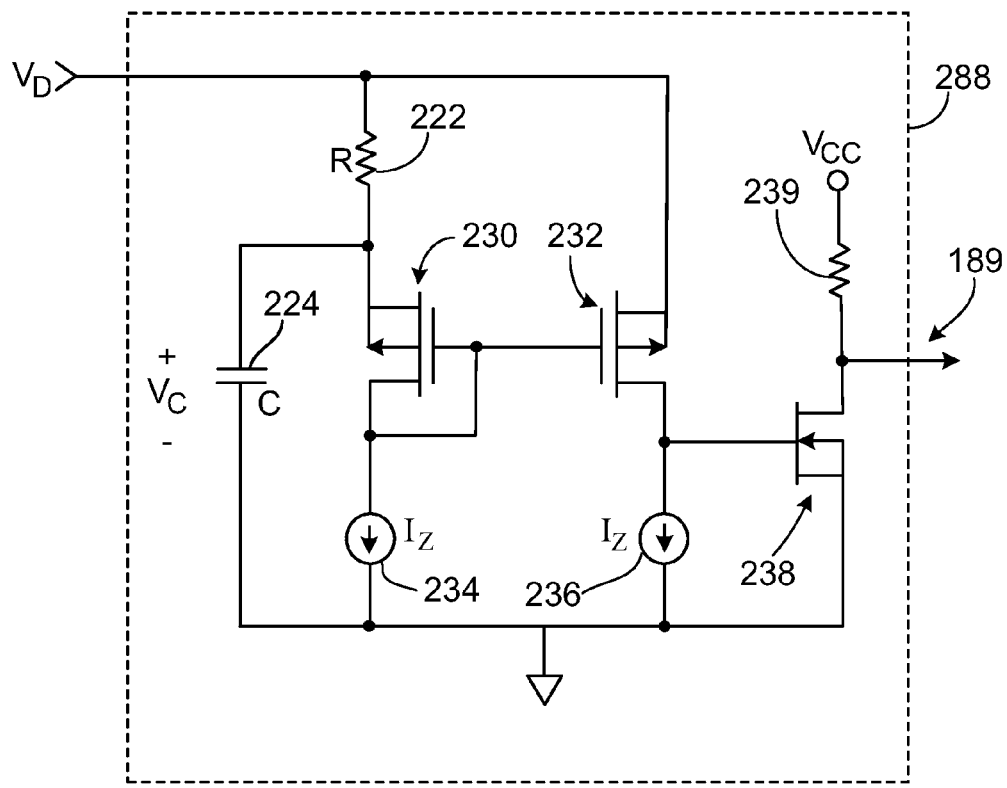
FIG. 13 shows a transistor-level embodiment of the second threshold detector of FIG. 12.

A transistor-level implementation of an adaptive second threshold detector circuit 288 is shown in FIG. 13. The detector circuit comprises p-channel MOSFET transistors 230, 232; resistor 222; capacitor 224; current sources 234, 236, each delivering a current Iz; n-channel MOSFET transistor 238; and output resistor 239. As in the block diagram of FIG. 12, the voltage Vc across capacitor 224 is the averaged value of the Vd offset by the flow of current Iz in resistor 222. Voltage Vc is compared to Vd by the pair of p-channel transistors 230, 232: when Vd drops below Vc, the n-channel MOSFET 238 is turned ON, driving the detector output 189 low; when Vd rises above Vc, the n-channel MOSFET 238 is turned OFF, driving the detector output 189 high. In an integrated circuit implementation of the circuit of FIG. 13, propagation delays of a few nanoseconds may be achieved.

Energy will accumulate in the series inductance (e.g. inductances Lb 15, La 19, FIG. 5) for as long as the rate-of-change of Ia, and hence the rate-of-change of energy in the series inductance, is positive. It is desirable to minimize the amount of energy that accumulates in the series inductance, as this will reduce both the amount of energy that is dissipated in the MOSFET (i.e. MOSFET 142, FIG. 5) and the amount of time required for Ia to decline to zero. This minimization may be accomplished by appropriate selection of the second threshold, VT2, as explained with reference to FIGS. 5, 17 and 18.

Figure 18A:
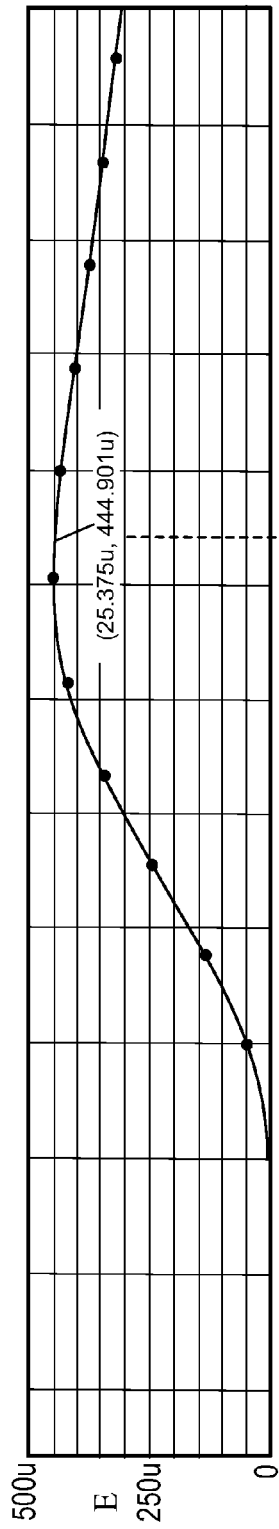
FIGS. 18A through 18C show waveforms for a TSC according to the present disclosure.
Figure 18B:
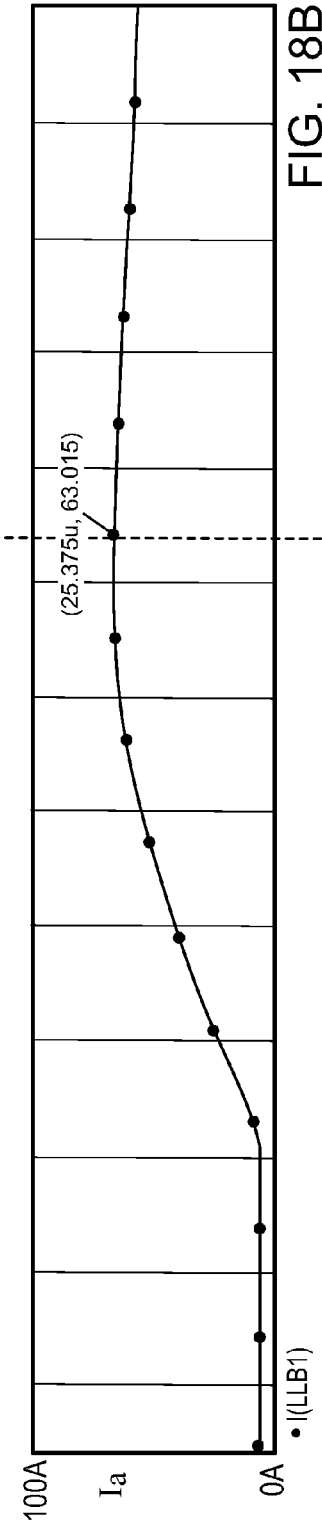
Figure 18C:
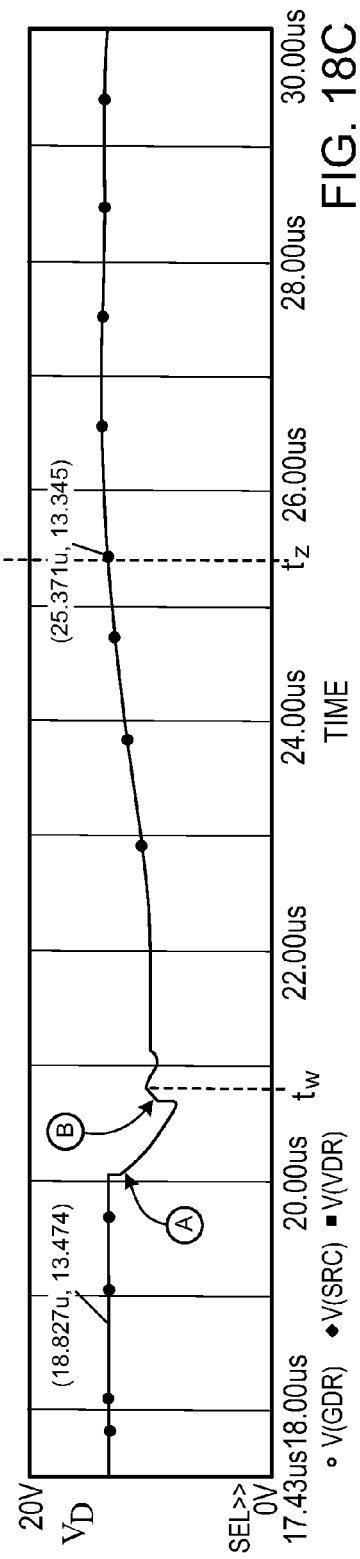

FIGS. 17 and 18 show simulation waveforms for a TSC circuit of the kind shown in FIG. 5 comprising: a P-Spice model for a Vishay-Siliconix Si4346DY MOSFET (see, e.g., Vishay-Siliconix Doc. ID: 77258, S-50836, Rev. B, May 16, 2005; Vishay-Siliconix is a division of Vishay Intertechnology, Inc., 63 Lancaster Avenue, Malvern, Pa.), the model being modified solely by the addition of a line item, RG=4, setting the gate resistance to 4 ohms (the addition resulting in better correlation between observed and simulated circuit behavior); an input source voltage Vin=13.5 VDC; a total series inductance La+Lb=200 nanohenries; and a total initial series resistance Ra+Rb=4 milliohms. The waveforms of FIGS. 17A-17C are for operation with VT2=10V, which corresponds to a value of Vd<Vin; the waveforms of FIGS. 18A-18C are for operation with VT2=14.5V, which corresponds to a value of Vd>Vin. FIGS. 17A and 18A show the accumulated energy, E, in the series inductance; FIGS. 17B and 18B show the current Ia; and FIGS. 17C and 18C show the MOSFET drain voltage Vd.

Referring to FIG. 17C, a short circuit occurs at the output of the TSC circuit at a time corresponding to the point labeled A, initiating a first phase that is terminated at a time corresponding to the point labeled B. Thereafter, Vd rises at an essentially constant rate during the second phase. Time tx is the time during the second phase at which both dIa/dt (and hence the voltage across the series inductance) and dE/dt go to zero, corresponding to the time when Vin−Vd=Ia*(Ra+Rb). If Ia*(Ra+Rb) is small relative to Vin, time tx is approximately the time at which Vd=Vin. After time tx, Vd continues to rise, the rate-of-change of both Ia and E (FIGS. 17B and 17A) become negative, and both Ia and E decline. At time ty, Vd=VT2=14.5 Volts and the second phase ends. Because the second phase ends when Vd>Vin and the rate-of-change of Ia and E are both negative, both Ia and E will continue to decline toward zero during the succeeding third phase.

The waveforms of FIG. 18 illustrate the effect of terminating the second phase when Vd<Vin and the rate-of-change of Ia and E are both positive. In FIG. 18C, a short circuit occurs at the output of the TSC circuit at a time corresponding to the point labeled A, initiating a first phase that is terminated at a time corresponding to the point labeled B. Thereafter, Vd rises at an essentially constant rate during a relatively short second phase which is terminated at time tw, when Vd=VT2=10 Volts. Because the third phase begins with the rate-of-change of both Ia and E being positive and with Vd<Vin, and because dVd/dt is controlled to be relatively low during the third phase, Ia and E will continue to increase until time tz, when dIa/dt and dE/dt are each essentially zero. The peak values of accumulated energy, E, and current, Ia, in the example of FIG. 18 are much higher than those in the example of FIG. 17, as are the amount of energy dissipated in the MOSFET and the amount of time required for Ia to decline to zero.

Accumulated inductive energy at the end of the second phase, and the subsequent length of the third phase, are each a function of the second threshold value. It is advantageous to select a second threshold value that corresponds to a rate of energy accumulation in the series inductance being at or near a threshold; in particular, it is desirable that the second threshold value correspond to a rate-of-change of energy accumulation in the series inductance that is zero or negative.

Figure 14:
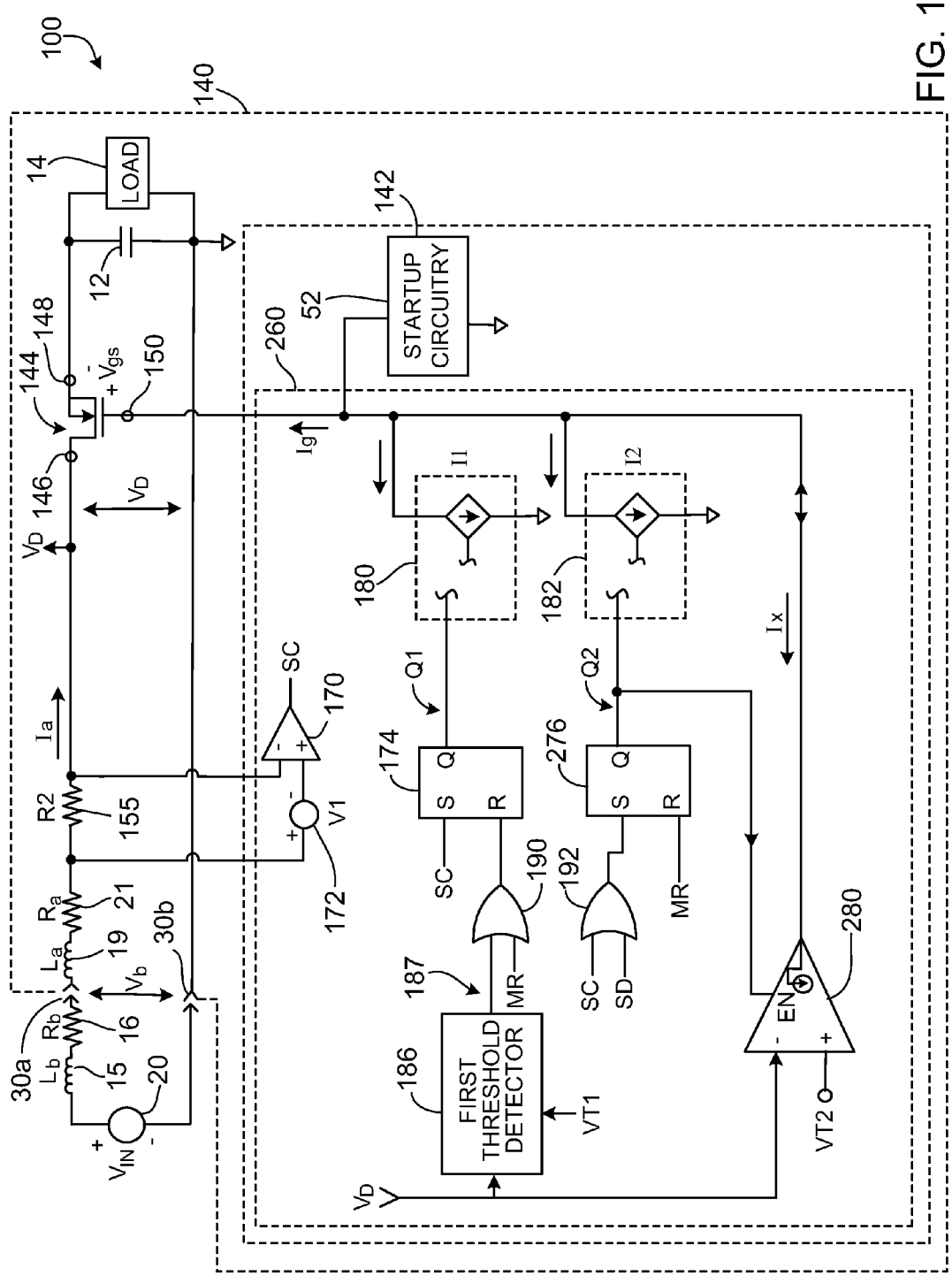
FIG. 14 shows apparatus comprising another embodiment of a TSC according to the present disclosure.

The TSC 160 of FIG. 5 uses a feedforward, open-loop, control configuration. A closed loop TSC configuration 260 is shown in FIG. 14. In the Figure, the signal SC at the output of comparator 170 goes high when an overcurrent condition occurs, setting first and second flip-flops 174, 276 and enabling controlled current sources 180, 182. The output of the second flip-flop, 276, is also connected to the enable input, EN, of transconductance amplifier 280: when EN is high, the transconductance amplifier can source and sink current, Ix, as described below; when EN is low the output of the transconductance amplifier is an open circuit and Ix=0. A first threshold detector 186 and associated first-flip flop 174, gate 190, and first controlled current source 180 perform the same function as the corresponding elements in the TSC 160 of FIG. 5: the first controlled current source sinks a relatively large current (e.g., 100 mA) until the first threshold detector, which can be any of the first threshold detector embodiments previously described, detects when the MOSFET enters its control region and turns the first controlled current source off.

Figure 15:
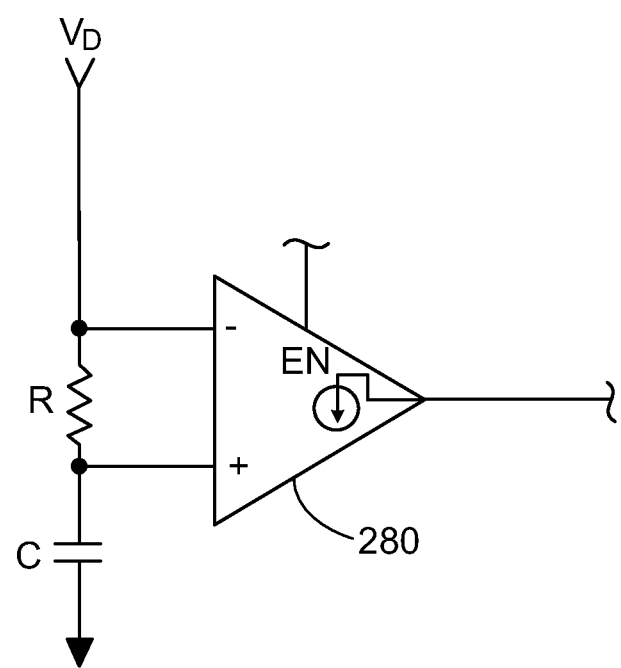
FIG. 15 shows an adaptive voltage sensing circuit configuration for use in the TSC of FIG. 14.

After the first controlled current source is turned off the gate current Ig comprises the current, I2, delivered by the second controlled current source 182, and the current, Ix, delivered from the output of transconductance amplifier 280. The current I2 may, for example, be 1 mA; the current delivered by the transconductance amplifier, Ix, may, for example, be a linear function of the voltage difference between its (+) and (−) inputs: when the difference is +12V, the current may be +8 mA; when the difference is −12V, the current may be −8 mA. The sum of I2 and Ix may therefore flow bidirectionally over a range. A setpoint for the drain voltage is set by the second threshold voltage VT2. As configured, the transconductance amplifier forms part of a closed loop that seeks to maintain Vd equal to VT2 by adjusting the magnitude and polarity of Ig as a function of the difference between Vd and VT2. VT2 may be a fixed voltage reference or it may be made adaptive by delivering it from a low-pass filter (e.g., an RC circuit) connected to Vd, as shown in FIG. 15.

Because a TSC of the kind shown in FIG. 5 operates in a feedforward, open-loop, configuration it may be less complex than, and be free of the stability and bandwidth issues associated with, a closed-loop solution.

A number of embodiments of the invention have been described. Nevertheless, it will be understood that various modifications may be made without departing from the spirit and scope of the invention. For example, the invention may be applied to other types of switching devices, such as bipolar transistors. Another way of sensing when a MOSFET switch has entered its control region is to sense the rapid and significant decrease in the rate-of-change of Vgs (e.g., after time t3 in FIGS. 6C, 7C and 8A). Sensing this change in slope may be exploited to perform first threshold detection.

What is claimed is:

1. An apparatus comprising:
a conductivity-controlled device having a control terminal and having a first terminal provided to connect to a source, the connection between the first terminal and the source being characterized by a connection impedance,
the conductivity-controlled device being characterized by a control region wherein the rate-of-change of voltage at the first terminal is a function of a signal at the control terminal;
a transient-suppression controller for turning off the conductivity-controlled device adapted to provide to the control terminal (a) a first control signal to transition the conductivity-controlled device from a high conductivity state towards a non-conductive state, and (b) a second control signal in response to the transient-suppression controller sensing that the conductivity-controlled device is at or near a predetermined area of the control region;
wherein the second control signal is smaller in magnitude than the first control signal and scaled to limit the rate-of-change of voltage at the first terminal as the conductivity-controlled device transitions to the non-conductive state.

2. The apparatus of claim 1 in which the conductivity-controlled device is a transistor.

3. The apparatus of claim 2 in which the device is a MOSFET transistor and the control terminal is the gate terminal of the MOSFET.

4. The apparatus of claim 3 in which the first terminal is either the drain terminal or the source terminal of the MOSFET.

5. The apparatus of claim 3 in which the first control signal and the second control signal are currents.

6. The apparatus of claim 3 in which the transient-suppression controller is configured to provide the first control signal in the form of a first current delivered to the gate terminal when the magnitude of the current flowing in the first terminal reaches a pre-determined current threshold.

7. The apparatus of claim 3 wherein the transient-suppression controller is configured to provide the second control signal in the form of a second current delivered to the gate terminal in response to a voltage at the first terminal.

8. The apparatus of claim 7 in which the MOSFET is an N-channel enhancement-mode device, the first terminal is the drain terminal of the MOSFET and the first and second control current signals sink current out of the gate.

9. The apparatus of claim 7 wherein the controller is configured to compare the voltage at the first terminal to a pre-determined first threshold value.

10. The apparatus of claim 7 wherein the controller is configured to compare an incremental change in the voltage at the first terminal to a pre-determined first threshold value.

11. The apparatus of claim 1 wherein the transient-suppression controller is adapted to sense the rate of change of voltage at the first terminal to detect whether the conductivity-controlled device is at or near a predetermined area of the control region.

12. An apparatus comprising:
a conductivity-controlled device having a control terminal and having a first terminal provided to connect to a source, the connection between the first terminal and the source being characterized by a connection impedance,
the conductivity-controlled device being characterized by a control region wherein the rate-of-change of voltage at the first terminal is a function of a signal at the control terminal;
a transient-suppression controller for turning off the conductivity-controlled device adapted to provide to the control terminal (a) a first control signal to transition the conductivity-controlled device from a high conductivity state towards a non-conductive state, (b) a second control signal when the conductivity-controlled device is at or near a predetermined area of the control region, and (c) a third control signal when a predetermined threshold condition is detected,
wherein the second control signal is smaller in magnitude than the first control signal and scaled to limit the rate-of-change of voltage at the first terminal as the conductivity-controlled device transitions to a non-conductive state; and
wherein the third control signal is smaller in magnitude than the second control signal and scaled to limit the rate of change of voltage at the first terminal as the conductivity-controlled device transitions to a non-conductive state.

13. The apparatus of claim 12 wherein the threshold condition comprises a rate of energy accumulation in the connection impedance being at or near a threshold.

14. The apparatus of claim 13 wherein the rate of change of energy accumulation in the connection impedance is zero or negative.

15. The apparatus of claim 12 wherein the conductivity-controlled device is a MOSFET, the control terminal is the gate terminal of the MOSFET, and the transient-suppression controller is configured to:
sense the voltage at the first terminal; and
detect when the voltage at the first terminal is at or near a second threshold, and, in response to said detecting, provide the third control signal in the form of a third current delivered to the gate terminal.

16. The apparatus of claim 15 in which the detection comprises comparing the voltage at the first terminal to a pre-determined second threshold value.

17. The apparatus of claim 16 in which the pre-determined second threshold value is equal to or greater than a voltage delivered by the source.

18. The apparatus of claim 15 in which the detection comprises comparing the voltage at the first terminal to an adaptive second threshold value.

19. The apparatus of claim 18 in which the transient-suppression controller is configured to generate the adaptive second threshold value by averaging the voltage at the first terminal.

20. The apparatus of claim 15 in which the MOSFET is an N-channel enhancement-mode device, the first terminal is the drain terminal of the MOSFET and the first, second and third control current signals sink current out of the gate.

21. Apparatus for use with a conductivity-controlled device having a control terminal and a first terminal for connection to a power source, the connection between the first terminal and the power source being characterized by a connection impedance, and the conductivity-controlled device being characterized by a control region wherein the rate-ofchange of voltage at the first terminal is a function of a signal at the control terminal, the apparatus comprising:
- a transient-suppression controller for turning off the conductivity-controlled device adapted to be connected to the control terminal of the conductivity-controlled device to provide (a) a first control signal to transition the conductivity-controlled device from a high conductivity state towards a non-conductive state, and (b) a second control signal in response to the transient-suppression controller sensing that the conductivity-controlled device is at or near a predetermined area of the control region;
- wherein the second control signal is smaller in magnitude than the first control signal and scaled to limit the rate-of-change of voltage at the first terminal as the conductivity-controlled device transitions to a non-conductive state.

22. The apparatus of claim 21 wherein the transient-suppression controller is further adapted to control the second control signal to maintain the voltage at the first terminal at a magnitude that is substantially equal to a setpoint value as the conductivity-controlled device transitions to a non-conductive state.

23. The apparatus of claim 22 wherein the transient-suppression controller is configured to sense the magnitude of a current flowing in the first terminal and provide the first control signal in response to the magnitude of the current flowing in the first terminal meeting a pre-determined current threshold.

24. The apparatus of claim 22 wherein the transient-suppression controller is configured to sense the voltage at the first terminal and provide the second control signal in response to the voltage at the first terminal meeting a first threshold.

25. The apparatus of claim 24 wherein the first threshold comprises a predetermined voltage level against which a magnitude of the voltage at the first terminal is compared.

26. The apparatus of claim 24 wherein the first threshold comprises an incremental voltage change against which an incremental change in the voltage at the first terminal is compared.

27. The apparatus of claim 22 wherein the transient-suppression controller is configured to control the voltage at the first terminal by adjusting the magnitude of the second control signal to reduce a difference between the voltage at the first terminal and the setpoint value.

28. The apparatus of claim 22 in which the setpoint value is a constant.

29. The apparatus of claim 22 in which the setpoint value is adjusted as a function of the average value of the voltage at the first terminal.

30. The apparatus of claim 21 in which the transient-suppression controller is further configured to:
- (c) provide a third control signal to the control terminal when a predetermined threshold condition is detected, wherein the third control signal is smaller in magnitude than the second control signal and scaled to limit the rate of change of voltage at the first terminal as the conductivity-controlled device transitions to a non-conductive state.

31. The apparatus of claim 21 wherein the transient-suppression controller is adapted to sense the rate of change of voltage at the first terminal to detect whether the conductivity-controlled device is at or near a predetermined area of the control region.

32. A method of turning off of a conductivity-controlled device having a control terminal and a first terminal for connection to a power source, the connection between the first terminal and the power source being characterized by a connection impedance, and the conductivity-controlled device being characterized by a control region wherein the rate-of-change of voltage at the first terminal is a function of a signal at the control terminal, the method comprising:
- providing a first control signal to the control terminal to transition the device from a high conductivity state towards a non-conductive state;
- providing a second control signal to the control terminal in response to sensing that the conductivity-controlled device is at or near a predetermined area of the control region; and
- scaling the second control signal to be of a magnitude that is smaller than the first control signal and that limits the rate-of-change of voltage at the first terminal as the conductivity-controlled device transitions to a non-conductive state.

33. The method of claim 32 wherein the providing a first control signal further comprises sensing the magnitude of a current flowing in the first terminal, and providing the first control signal in response to the magnitude of the current flowing in the first terminal meeting a pre-determined current threshold.

34. The method of claim 32 wherein the providing the second control signal further comprises sensing the voltage at the first terminal, detecting a condition in which the voltage at the first terminal meets a first threshold, and providing the second control signal in response to the detecting.

35. The method of claim 34 wherein the detecting comprises providing a pre-determined first threshold value, and comparing the voltage at the first terminal to the pre-determined first threshold value.

36. The method of claim 34 wherein the detecting comprises providing a pre-determined first threshold value, sensing an incremental change in the voltage at the first terminal, and comparing the incremental change to the pre-determined first threshold value.

37. The method of claim 32 further comprising providing a third control signal to the control terminal for a predetermined threshold condition and scaling the third control signal to be of a magnitude that is smaller than the second control signal and that limits the rate-of-change of voltage at the first terminal as the conductivity-controlled device transitions to a non-conductive state.

38. The method of claim 37 wherein the predetermined threshold condition comprises a rate of energy accumulation in the connection impedance being at or near a threshold.

39. The method of claim 38 wherein the rate of change of energy accumulation in the connection impedance is zero or negative.

40. The method of claim 37 wherein the providing the third control signal further comprises sensing the voltage at the first terminal, detecting when the voltage at the first terminal is at or near a second threshold, and providing the third control signal in response to the detecting.

41. The method of claim 40 wherein the detecting comprises using a pre-determined value for the second threshold, and comparing the voltage at the first terminal to the pre-determined value.

42. The method of claim 41 wherein the pre-determined second threshold value is equal to or greater than a voltage delivered by the power source.

43. The method of claim 40 wherein the detecting comprises generating an adaptive second threshold voltage for the second threshold, and comparing the voltage at the first terminal to the adaptive second threshold value.

44. The method of claim 43 wherein generating the adaptive threshold voltage comprises averaging the voltage at the first terminal.

45. The method of claim 32 further comprising:
providing a setpoint value related to a desired voltage at the first terminal, and,
controlling the second control signal to influence the voltage at the first terminal toward a predetermined relationship with the setpoint value as the conductivity-controlled device transitions to a non-conductive state.

46. The method of claim 45 wherein providing the first and second control signals comprises providing currents.

47. The method of claim 45 wherein providing the first control signal further comprises detecting when the magnitude of a current flowing in the first terminal reaches a pre-determined current threshold, in response to which the first control signal is provided in the form of a current.

48. The method of claim 47 wherein providing a second control signal further comprises:
sensing the voltage at the first terminal,
detecting when the voltage at the first terminal is at or near the first threshold, and,
in response to said detecting, providing the second control signal in the form of a second current delivered to the gate terminal.

49. The method of claim 48 wherein detecting comprises:
providing a pre-determined first threshold value, and,
comparing the voltage at the first terminal to the pre-determined first threshold value.

50. The method of claim 48 wherein the detecting comprises:
providing a pre-determined first threshold value,
sensing an incremental change in the voltage at the first terminal, and,
comparing the incremental change to the pre-determined first threshold value.

51. The method of claim 45 wherein the controlling comprises:
measuring a difference between the voltage at the first terminal and the setpoint value, and,
controlling the magnitude of the second control current to reduce the difference between the voltage at the first terminal and the setpoint value.

52. The method of claim 45 wherein providing a setpoint value comprises providing a constant value for the setpoint.

53. The method of claim 45 wherein providing a setpoint value comprises:
measuring an averaged value of the voltage at the first terminal, and,
generating an adaptive setpoint value based upon the averaged value.

54. The method of claim 34 further comprising:
providing an N-channel MOSFET enhancement-mode device for use as the conductivity-controlled device;
connecting a drain terminal of the MOSFET as the first terminal;
connecting a gate terminal of the MOSFET as the control terminal;
sinking current out of the gate terminal for the first control signal; and
sinking current out of the gate terminal for the second control signal.

55. The method of claim 54 further comprising:
providing a third control signal to the gate terminal for a predetermined threshold condition and scaling the third control signal to be of a magnitude that is smaller than the second control signal and that limits the rate-of-change of voltage at the drain terminal as the MOSFET transitions to a non-conductive state; and
sinking current out of the gate terminal for the third control signal.

56. The method of claim 32 wherein the sensing further comprises sensing the rate of change of voltage at the first terminal.

\* \* \* \* \*